(12) United States Patent
Fukuda et al.

(10) Patent No.: US 7,656,228 B2
(45) Date of Patent: Feb. 2, 2010

(54) MATCHING CIRCUIT AND MULTI-BAND AMPLIFIER

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 32 days.

(21) Appl. No.: 11/926,764

(22) Filed: Oct. 29, 2007

(65) Prior Publication Data
US 2008/0129410 A1 Jun. 5, 2008

(30) Foreign Application Priority Data
Oct. 30, 2006 (JP) ............... 2006-294642

(51) Int. Cl.
*H03F 3/68* (2006.01)
(52) U.S. Cl. ...................... 330/126; 330/302
(58) Field of Classification Search ........... 330/126, 330/302, 124 R, 295
See application file for complete search history.

(56) References Cited

U.S. PATENT DOCUMENTS

| | | | |
|---|---|---|---|
| 5,404,113 A * | 4/1995 | Nitardy | 330/10 |
| 5,973,568 A * | 10/1999 | Shapiro et al. | 330/295 |
| 6,298,244 B1 | 10/2001 | Boesch et al. | |
| 6,317,608 B1 | 11/2001 | Glöcker | |
| 7,116,851 B2 * | 10/2006 | Welch et al. | 385/14 |

FOREIGN PATENT DOCUMENTS

| | | |
|---|---|---|
| EP | 0 959 567 A1 | 11/1999 |
| EP | 1 496 621 A1 | 1/2005 |
| JP | 2004-343419 | 12/2004 |
| WO | WO 99/01931 | 1/1999 |
| WO | WO 2006/066461 A1 | 6/2006 |

OTHER PUBLICATIONS

U.S. Appl. No. 12/115,853, filed May 6, 2008, Fukuda, et al.
Koji Chiba, et al., "Mobile Terminals", NTT DOCOMO Technical Journal, vol. 10, No. 1, Nov. 2001, pp. 14-19.
Atsushi Fukuda, et al, "Multi-band Power Amplifier Employing MEMS Switches for Optimum Matching", General Conference of the Institute of Electronics, Information and Communication Engineers, 2004, p. 39 (with Partial English translation).

* cited by examiner

*Primary Examiner*—Henry K Choe
(74) *Attorney, Agent, or Firm*—Oblon, Spivak, McClelland, Maier & Neustadt, L.L.P.

(57) ABSTRACT

A matching circuit includes a demultiplexer for demultiplexing a signal outputted from an amplification device into signals of respective frequency bands, and at least two matching blocks which are connected to the demultiplexer, are respectively fed with the signals of the respective frequency bands, and perform impedance matching in the respective frequency bands of the inputted signals. Impedance matching is performed on each of the demultiplexed signals of the respective frequency bands, thereby achieving a matching circuit capable of efficiently performing impedance matching in the respective frequency bands. With this matching circuit, it is possible to achieve a multi-band amplifier capable of simultaneously amplifying signals of multiple frequency bands with high efficiency and low noise.

15 Claims, 22 Drawing Sheets

MATCHING CIRCUIT AND MULTI-BAND AMPLIFIER

TECHNICAL FIELD

The present invention relates to a matching circuit for obtaining impedance matching between an amplification device and a peripheral circuit thereof to efficiently perform amplification. The present invention also relates to multi-band amplifiers which are capable of amplifying signals of multiple frequencies one by one or at the same time.

BACKGROUND ART

The diversification of radio communication service has increased demand for multi-band radio sets for processing signals of multiple frequency bands. In radio sets, an absolutely necessary device is a power amplifier. For efficient amplification, it is necessary to obtain impedance matching between an amplification device for amplifying a signal and a peripheral circuit of the device. Matching circuits are used for this purpose. Here, the input/output impedances of the peripheral circuit are generally set at a fixed value. Hereinafter, the input/output impedance of the peripheral circuit will be referred to as a "system impedance $Z_0$".

The reflection coefficient (S parameter) of the input and output of an amplification device used for an amplifier can be measured as shown in FIG. 1. Based on the reflection coefficient and the system impedance $Z_0$, the input/output impedance of the amplification device can be measured. "S11" denotes the reflection coefficient of the input side of the amplification device and "S22" denotes the reflection coefficient of the output side of the amplification device.

The input/output impedances of the amplification device have frequency characteristics shown in FIG. 1. When an amplifier is designed using the amplification device, it is necessary to match the input/output impedances in each frequency band to the system impedance $Z_0$.

Therefore, when designing a multi-band power amplifier, it is necessary to match the input/output impedances in each frequency band to the system impedance $Z_0$.

Thus conventionally, when signals of multiple frequency bands are amplified, amplifiers including amplification devices and matching circuits are provided as many as frequency bands to be used and one of the amplifiers is selected according to a used frequency band as in, for example, an amplifier used in "band-sharing mobile equipment" (see, e.g., Non-patent document 1: "Mobile Equipment", Koji Chiba et al., NTT DoCoMo technical journal, Vol. 10, No. 1). In another method, a matching circuit is designed to obtain a state close to impedance matching over used frequency bands. In still another method, some circuit constants of a matching circuit are changed.

The following will describe the method in which the circuit constants of a matching circuit are changed. The circuit constants of the matching circuit can be changed using variable devices and so on. As a matching circuit having a low loss, a matching circuit 700 of FIG. 2 is proposed which includes a main matching block 701, a delay circuit 702 having one end connected to the main matching block 701, a sub matching block 703, and a switching device 704 connected between the other end of the delay circuit 702 and one end of the sub matching block 703 (for example, see Non-patent literature 2: "Multi-band Power Amplifier using MEMS Switch", Atsushi Fukuda et al., General conference C-2-4, the Institute of Electronics, Information and Communication Engineers, 2004).

The matching circuit 700 shown in FIG. 2 matches an impedance $Z_L(f)$ of a circuit connected to a port $P_2$ and having frequency characteristics to an input impedance $Z_0$ of the port $P_1$. For example, the matching circuit acts as a matching circuit for signals of two frequency bands having frequencies $F_1$ and $F_2$ of FIG. 3 as center frequencies.

When the switching device 704 is turned off, the circuit of FIG. 2 acts as a matching circuit for a signal of the frequency band having the frequency $F_1$ as the center frequency. When the switching device 704 is turned on, the circuit of FIG. 2 acts as a matching circuit for a signal of the frequency band having the frequency $F_2$ as the center frequency. The states (ON/OFF) of the switching device 704 are switched thus, so that the matching circuit can be configured for the signals of the two frequency bands. In this case, by using, for example, MEMS technique for the switching device 704, both of a low insertion loss and a high isolation can be relatively easily obtained over a wide band, so that a multi-band power amplifier can be configured with excellent characteristics.

In the method in which amplifiers including amplification devices and matching circuits are provided as many as frequency bands to be used and the amplifiers are switched according to a used frequency, it is necessary to provide different amplifiers for the respective frequency bands to be used, resulting in a large circuit size.

On the other hand, in the method using a matching circuit designed for a wide band and the method in which the circuit constants of a matching circuit are changed, there is an advantage in circuit size reduction and so on as compared with the method of switching amplifiers.

However, when using a matching circuit designed for a wide band, it is difficult to optimally design the matching circuit for used frequency bands. Particularly, problems arise in the design of a power amplifier requiring highly efficient operations.

In the method in which the circuit constants of a matching circuit are changed with reference to FIG. 2, the matching circuit can be optimally designed for used frequencies with relative ease, achieving a high power and highly efficient operations at each operating frequency.

However, there is a problem that signals of used frequency bands cannot be efficiently amplified at the same time. To be specific, when signals of multiple frequency bands are to be efficiently amplified at the same time, the same problem as wide-band matching arises, that is, it is difficult to optimally design the matching circuit for each operating frequency. Particularly problems arise in the design of a power amplifier requiring highly efficient operations.

SUMMARY OF THE INVENTION

An object of the present invention is to provide a matching circuit efficiently operating for signals of multiple frequency bands, and a multi-band amplifier capable of efficiently amplifying the signals of the multiple frequency bands at the same time.

A first matching circuit of the present invention includes a demultiplexer for demultiplexing a signal outputted from an amplification device into signals of respective frequency bands, and at least two matching blocks which are connected to the demultiplexer, are respectively fed with the signals of the respective frequency bands, and perform impedance matching in the respective frequency bands of the inputted signals.

A second matching circuit of the present invention includes at least two matching blocks which are respectively fed with signals of respective frequency bands and perform impedance matching in the respective frequency bands of the inputted signals, and a multiplexer which is connected to the at least two matching blocks, multiplexes signals outputted from the matching blocks, and output the multiplexed signal to an amplification device.

A first multi-band amplifier of the present invention includes an amplification device for amplifying an inputted signal and outputting the signal to the demultiplexer of the first matching circuit, and the first matching circuit.

A second multi-band amplifier of the present invention includes a second matching circuit and an amplification device for amplifying a signal outputted from the multiplexer of the matching circuit and outputting the amplified signal.

BEST MODES FOR CARRYING OUT THE INVENTION

First Embodiment

Figure 1:
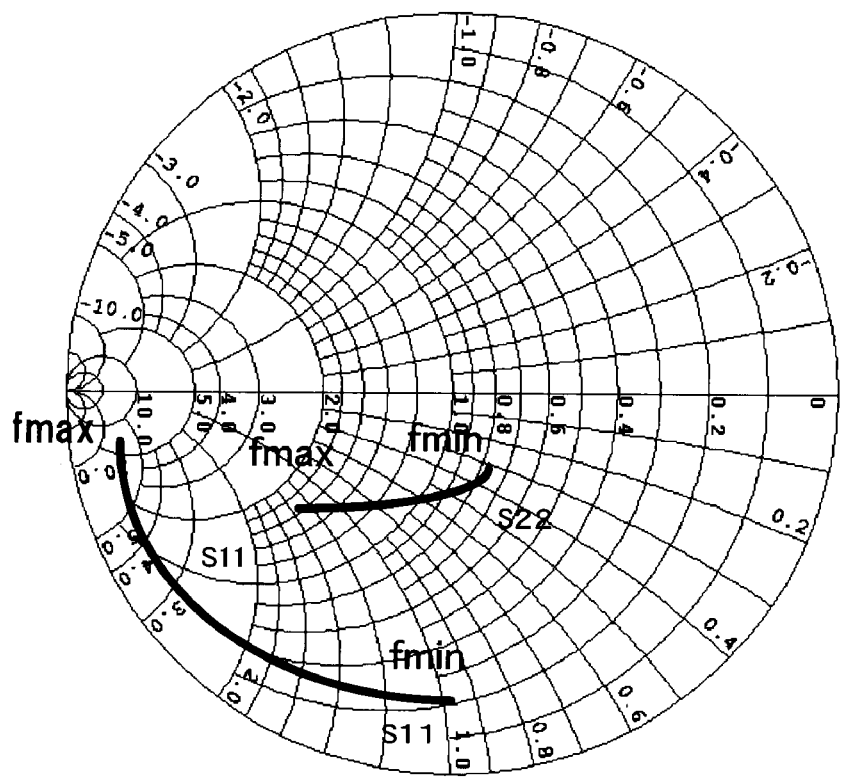
FIG. 1 is a view showing the frequency characteristics of the input/output impedances of an amplification device.
Figure 2:
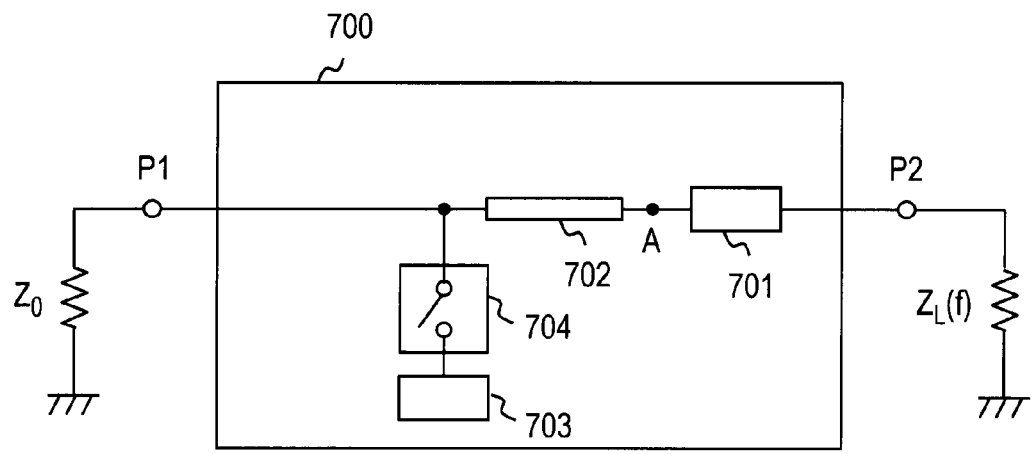
FIG. 2 is a view showing the function and configuration of a matching circuit for changing a circuit constant according to related art.
Figure 3:
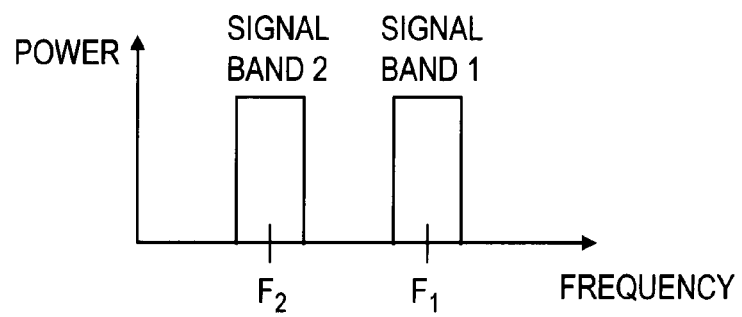
FIG. 3 is an auxiliary view showing the function and configuration of a matching circuit for changing a circuit constant according to related art.
Figure 4:
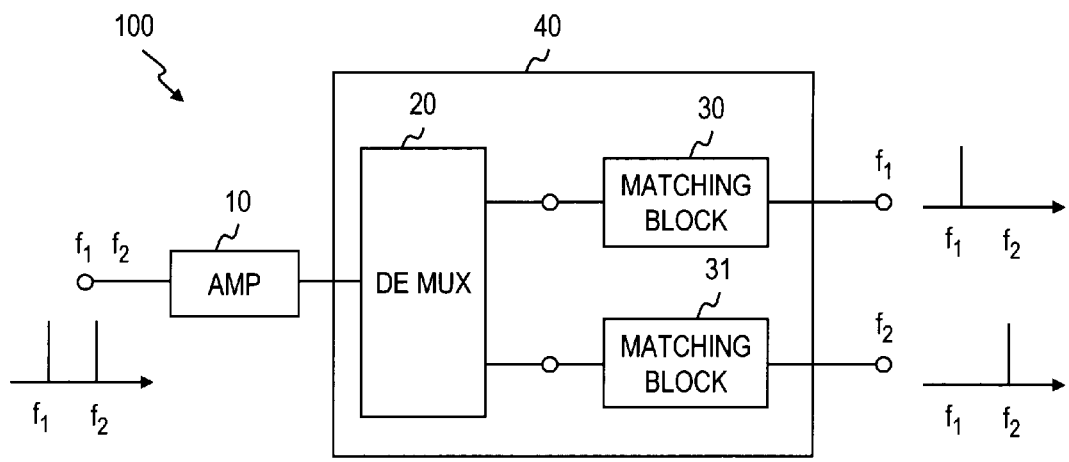
FIG. 4 is a view showing the function and configuration of a multi-band amplifier 100 according to a first embodiment.

FIG. 4 shows an embodiment of an output-side circuit of a multi-band amplifier. A matching circuit of the present invention is provided on the output side of an amplification device of the multi-band amplifier, so that a power amplifier can be designed with high efficiency and high performance. A multi-band amplifier 100 shown in FIG. 4 amplifies signals of two frequency bands $f_1$ and $f_2$. The multi-band amplifier 100 is made up of an amplification device 10 and a matching circuit 40. The matching circuit 40 is made up of a demultiplexer 20, a matching block 30, and a matching block 31.

The amplification device 10 is fed with a combined signal of the signal of the first frequency band $f_1$ and the signal of the second frequency band $f_2$. The amplification device 10 amplifies the inputted signal and outputs the amplified signal to the demultiplexer 20. The demultiplexer 20 demultiplexes the signal having been amplified by the amplification device 10 into the signal of the frequency band $f_1$ and the signal of the frequency band $f_2$, and outputs the signals to the different matching blocks. In this embodiment, the signal of the frequency band $f_1$ is outputted to the matching block 30 and the signal of the frequency band $f_2$ is outputted to the matching block 31.

This is because regarding the signal of the frequency band $f_1$, an impedance is sufficiently high when viewing the matching block 31 from the output terminal of the amplification device 10 through the demultiplexer 20. Moreover, this is because regarding the signal of the frequency band $f_2$, an impedance is sufficiently high when viewing the matching block 30 from the output terminal of the amplification device 10 through the demultiplexer 20.

The matching block 30 matches a system impedance $Z_0$ and the impedance obtained for the signal of the frequency band $f_1$ with respect to the demultiplexer 20. Further, the matching block 31 matches the system impedance $Z_0$ and the impedance obtained for the signal of the frequency band $f_2$ with respect to the demultiplexer 20.

In this case, the matching block 30 and the matching block 31 only have to obtain matching for the signals of the corresponding frequency bands. The design of one of the matching blocks is not related to the configuration of the other matching block. Thus the matching blocks can be separately designed, so that the most suitable matching blocks can be configured for the respective frequency bands. It is therefore possible to configure a multi-band amplifier with high power and high efficiency in the frequency band $f_1$ and the frequency band $f_2$.

Even when the signals of the two frequency bands are simultaneously inputted, each of the matching blocks is fed only with the signal of the corresponding frequency band, thereby achieving high-efficiency and high-power amplification in theory as in the case where the signal of one of the frequency bands is inputted.

The widths of the frequency bands $f_1$ and $f_2$ can be set as appropriate. For example, the number of frequencies included in the frequency band $f_1$ and the number of frequencies included in the frequency band $f_2$ may be different from each other. Further, the frequency band $f_1$ may include a single frequency $F_1$ and the frequency band $f_2$ may include a single frequency $F_2$. The smaller the width of the frequency band, it is more easy to design a multi-band amplifier with high power and high efficiency. Moreover, the frequencies $F_1$ and $F_2$ included in the frequency bands f may have discrete values.

<Multiple Bands 1>

Figure 5:
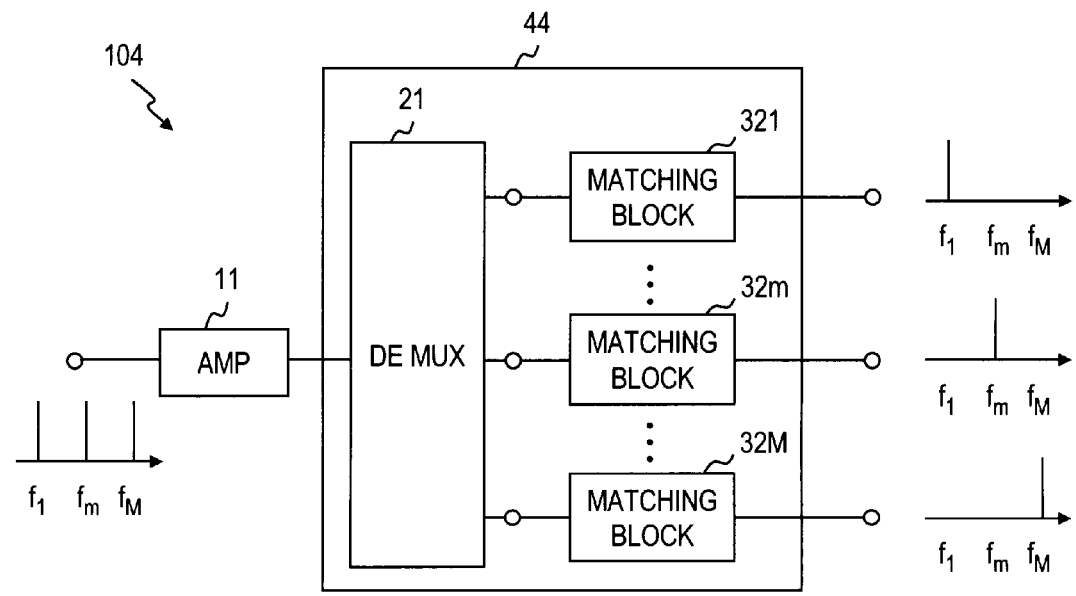
FIG. 5 is a view showing the function and configuration of a multi-band amplifier 104 for multiple bands.

The multi-band amplifier 100 can be expanded for multiple bands and shared use with multiple bands. FIG. 5 shows an embodiment of an output-side circuit of a multi-band amplifier 104 for multiple bands.

The multi-band amplifier 104 shown in FIG. 5 amplifies the signals of M frequency bands $f_1, \ldots, f_m, \ldots, f_M$. The multi-band amplifier 104 is made up of an amplification device 11 and a matching circuit 44. The matching circuit 44 is made up of a demultiplexer 21 and M matching blocks 321, ..., 32m, ..., 32M.

The amplification device 11 is fed with a combined signal of the signals of the M frequency bands from the first frequency band $f_1$ to the M-th frequency band $f_M$. The amplification device 11 amplifies the inputted signal and outputs the amplified signal to the demultiplexer 21. The demultiplexer 21 demultiplexes the signal having been amplified by the amplification device 11 into M signals of the frequency band $f_1$ to the frequency band $f_M$, and outputs the demultiplexed signals of the respective frequency bands to the different matching blocks. In this embodiment, the signal of the frequency band $f_1$ is outputted to the matching block 321, the signal of the frequency band $f_m$ is outputted to the matching block 32m, and the signal of the frequency band $f_M$ is outputted to the matching block 32M.

This is because regarding the signal of the frequency band $f_m$ ($1 \leq m \leq M$), an impedance is sufficiently high when viewing the matching blocks other than the matching block 32m from the output terminal of the amplification device 11 through the demultiplexer 21.

Further, each of the matching blocks 32m ($1 \leq m \leq M$) matches the system impedance $Z_0$ and an impedance obtained for the signal of the frequency band $f_m$ with respect to the demultiplexer 21.

In this case, the matching blocks only have to obtain matching for the signals of the corresponding frequency bands. The design of one of the matching blocks is not related to the configuration of the other matching blocks. Thus the matching blocks can be separately designed, so that the most suitable matching blocks can be configured for the respective frequency bands. It is therefore possible to configure a multi-band amplifier with high power and high efficiency in the frequency bands $f_m$ ($1 \leq m \leq M$).

Even when the signals of the M frequency bands are simultaneously inputted, each of the matching blocks is fed only with the signal of the corresponding frequency, thereby achieving, for example, high-efficiency and high-output amplification in theory as in the case where the signal of one of the frequencies is inputted.

<Multiple Bands 2>

A filter composing the demultiplexer may have the function of changing a frequency to allow the passage of signals of at least one of frequencies ($F_{m1}$ to $F_{mp}$) included in the frequency band $f_m$ (p represents an integer not smaller than 2). In other words, signals of some of the frequencies ($F_{m1}$ to $F_{mp}$) included in the frequency band $f_m$ may be passed.

In this case, it is preferable that the matching block has the function of changing a frequency. Thus it is possible to perform impedance matching according to the frequency of the signal passed by a frequency variable filter, achieving operations with high power and high efficiency.

Figure 6:
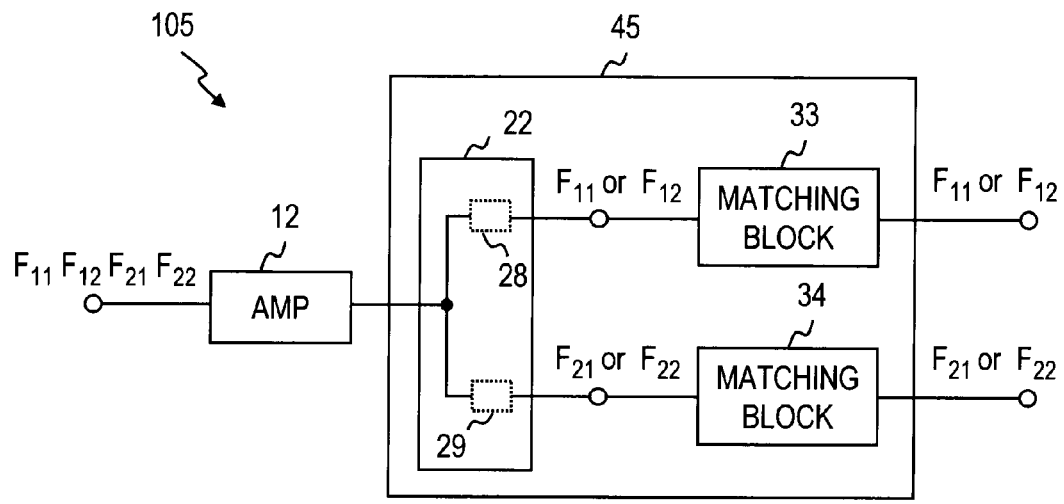
FIG. 6 is a view showing the function and configuration of a multi-band amplifier 105 for multiple bands.

FIG. 6 shows an example of a multi-band amplifier including a demultiplexer which uses filters having the function of changing a frequency and matching blocks which have the function of changing a frequency. A multi-band amplifier 105 includes an amplification device 12 and a matching circuit 45. The amplification device 12 amplifies a combined signal of a signal of the frequency band $f_1$ including two frequencies $F_{11}$ and $F_{12}$ and a signal of the frequency band $f_2$ including two frequencies $F_{21}$ and $F_{22}$. The matching circuit 45 has a demultiplexer 22 which includes frequency variable filters 28 and 29 having the function of changing a frequency and matching blocks 33 and 34 which have the function of changing a frequency.

The frequency variable filter 28 of the demultiplexer 22 allows the passage of the signal of one of the frequencies $F_{11}$ and $F_{12}$. Likewise, the frequency variable filter 29 of the demultiplexer 22 allows the passage of the signal of one of the frequencies $F_{21}$ and $F_{22}$.

The matching block 33 is preset to perform impedance matching at the frequency of the signal passed by the frequency variable filter 28 and thus the impedance matching is performed at the frequency of the signal passed by the frequency variable filter 28. Likewise, the matching block 34 is also preset to perform impedance matching at the frequency of the signal passed by the frequency variable filter 29 and thus the impedance matching is performed at the frequency of the signal passed by the frequency-variable filter 29.

With this configuration, a user of the present invention can select a frequency of the signal to be amplified, from one of the frequencies $F_{11}$ and $F_{12}$ and one of the frequencies $F_{21}$ and $F_{22}$.

As described above, by providing the filters of the demultiplexer 22 and the matching blocks with the function of changing a frequency, it is possible to configure a high-efficiency and high-power multi-band amplifier for multiple bands and shared use with multiple bands.

<Pre-matching Circuit>

Figure 7:
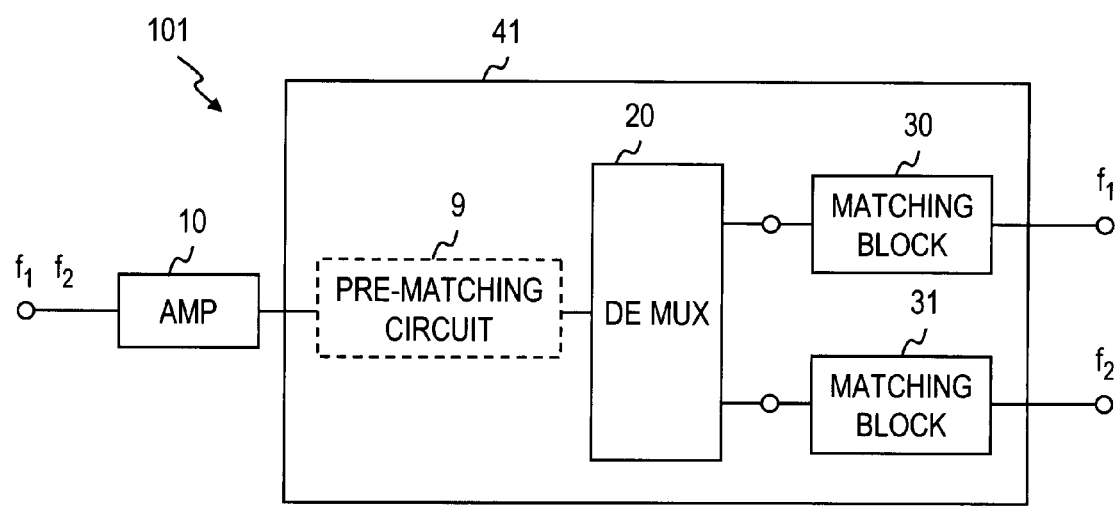
FIG. 7 is a view showing the function and configuration of a multi-band amplifier 101 including a pre-matching circuit.

As indicated by a broken line in FIG. 7, a pre-matching circuit 9 may be provided between the amplification device 10 and the demultiplexer 20. The pre-matching circuit 9 is, for example, a circuit for changing the output impedance of the amplification device 10 to a value allowing the demultiplexer 20 and the matching blocks 30 and 31 to be designed with ease. Further, when the pre-matching circuit 9 is a harmonic processing circuit, a multi-band amplifier 101 can be further efficient. In this way, the pre-matching circuit 9 is applicable to various uses.

<Multiplexing Circuit>

Figure 8:
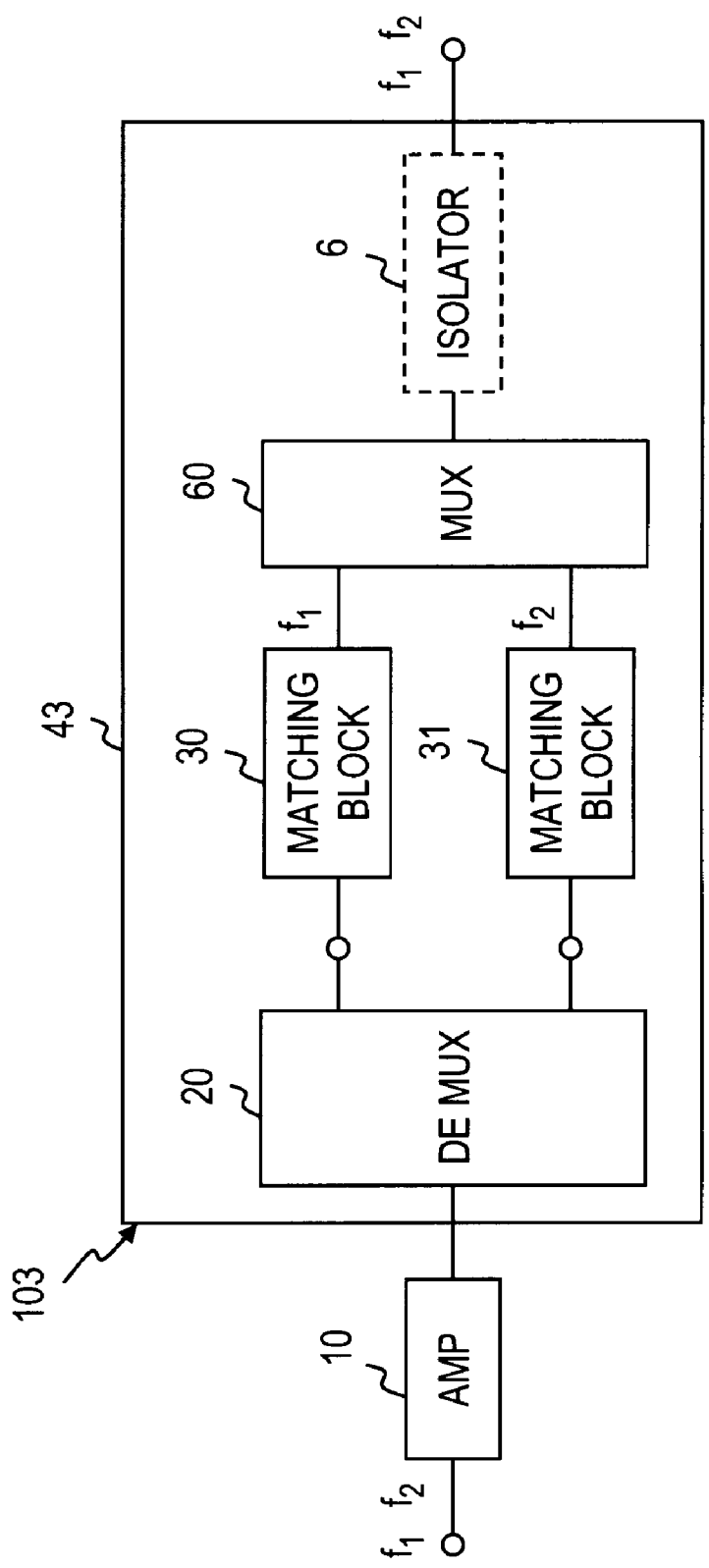
FIG. 8 is a view showing the function and configuration of a multi-band amplifier 103 including a multiplexer.

As shown in FIG. 8, a matching circuit 43 may include a multiplexer 60. The multiplexer 60 combines the signal of the frequency band $f_1$ inputted from the matching block 30 and the signal of the frequency band $f_2$ inputted from the matching block 31, and outputs the combined signal. With this configuration, a multi-band amplifier 103 can be configured with a single output.

<Isolator>

Figure 9A:
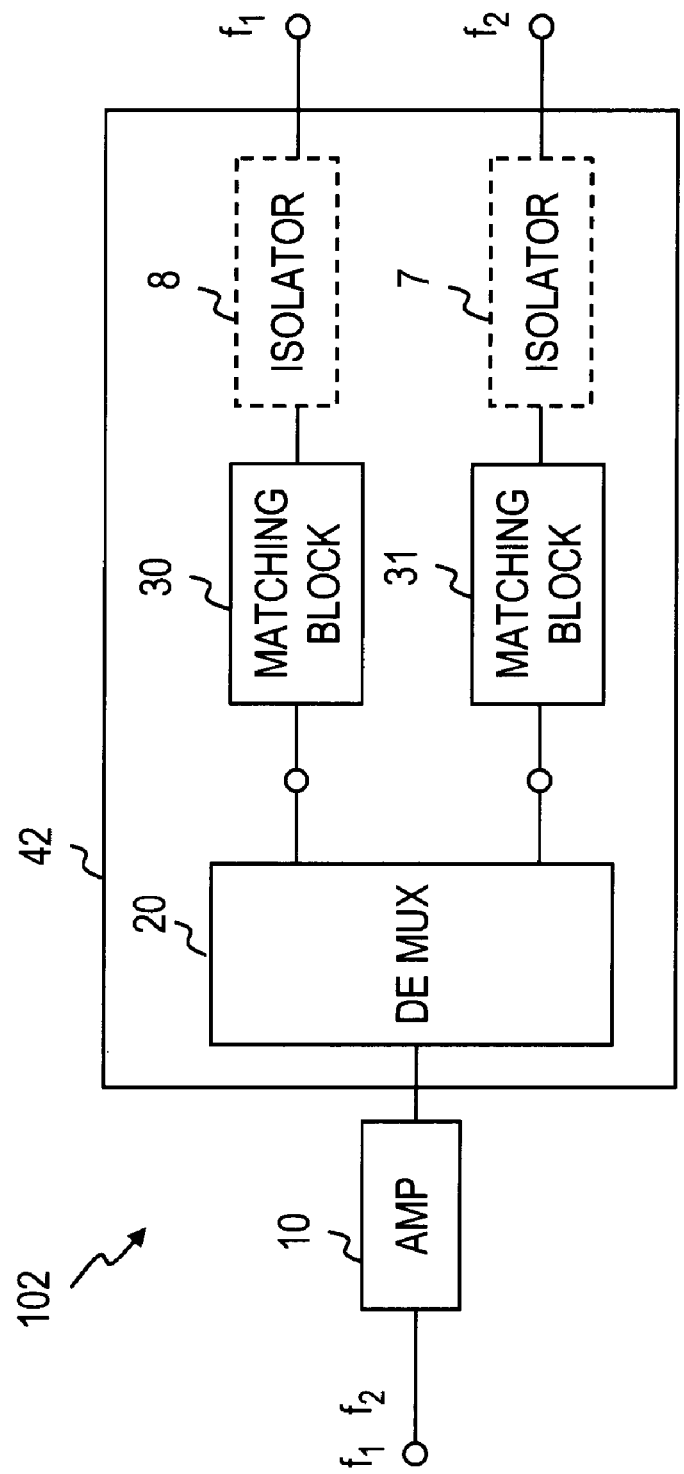
FIG. 9A is a view showing the function and configuration of a multi-band amplifier 102 including isolators.

FIG. 9A shows a multi-band amplifier 102 having an isolator 8 and an isolator 7 in a matching circuit 42. The isolator 8 operates in the frequency band $f_1$ and is connected to the output terminal of the matching block 30. The isolator 7 operates in the frequency band $f_2$ and is connected to the output terminal of the matching block 31. A signal amplified by the multi-band amplifier 102 is fed to an antenna (not shown) and the impedance of the antenna is expected to change with usage conditions. In this case, since the output impedance of the multi-band amplifier 102 changes, the matching state of the multi-band amplifier 102 changes and the characteristics deteriorate. By providing the isolator 8 and the isolator 7, it is possible to prevent the changes of the impedance of the antenna from affecting the amplification characteristics of the multi-band amplifier 102.

An inexpensive isolator has a narrow operating frequency range and thus the operating frequency band of a radio circuit including the isolator may depend upon the characteristics of the isolator. In the multi-band amplifier 102 of FIG. 9A, even when spacing between the frequency band $f_1$ and the frequency band $f_2$ is wider as compared with the operating frequencies of the isolators, the isolators only have to correspond to the respective frequency bands.

Figure 9B:
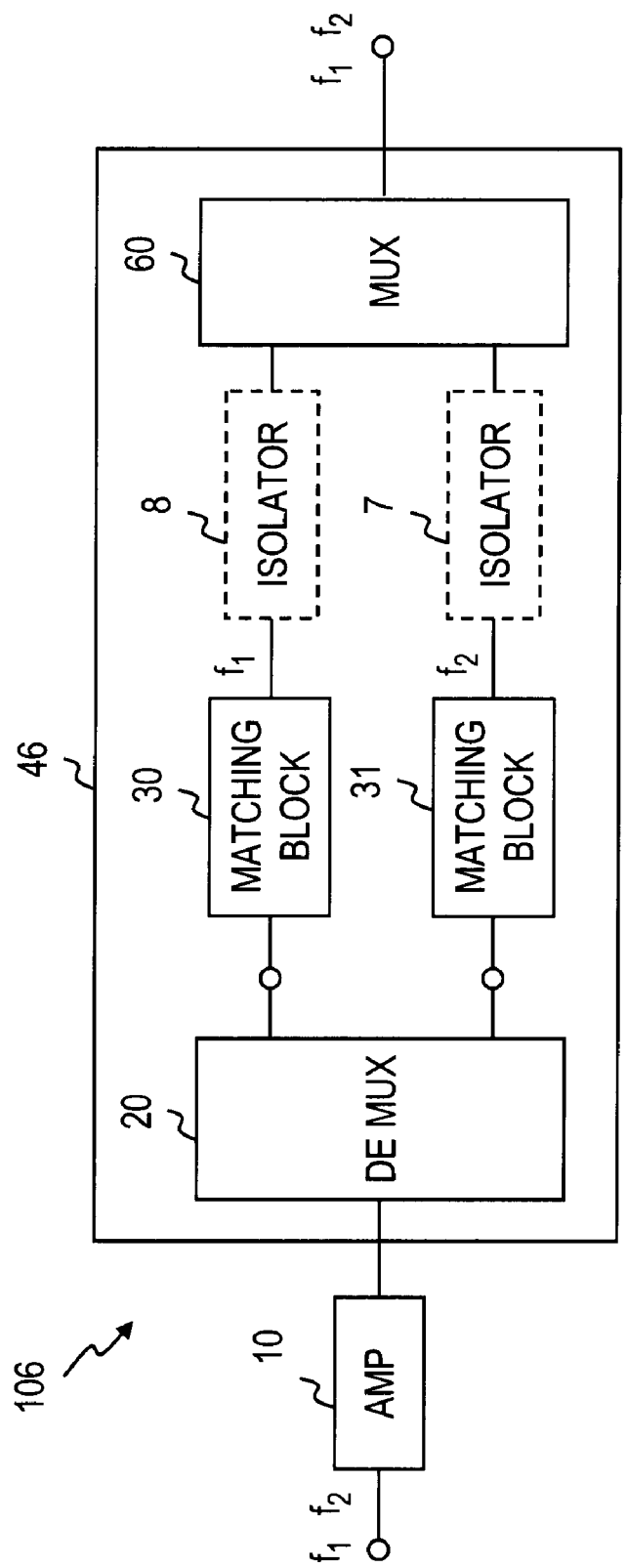
FIG. 9B is a view showing the function and configuration of the multi-band amplifier 102 including a multiplexer and isolators.

As shown in FIG. 9B, the multiplexer 60 for multiplexing signals outputted from the isolators 8 and 9 is provided in a matching circuit 46, so that a multi-band amplifier 106 can be configured with a single output.

When using a multi-band isolator or a wide-band isolator, as shown in FIG. 8, the isolator 6 is provided on the output terminal of the multiplexer 60 for multiplexing the outputs of the matching block 30 and the matching block 31.

In addition to the configuration of FIG. 9B, the methods of multiple bands 1 and 2, the pre-matching circuit, the multiplexer, and the isolators can be combined as appropriate.

<Demultiplexer>

Figure 10A:
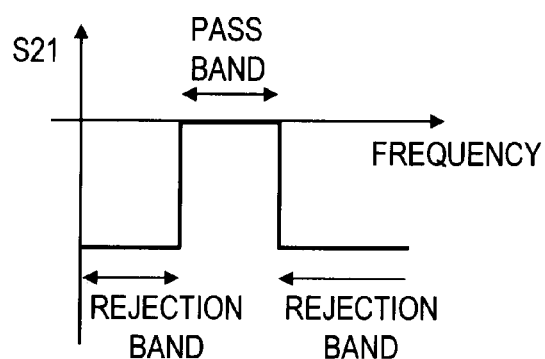
FIG. 10A is a view showing the characteristics of an ideal band pass filter.
Figure 10B:
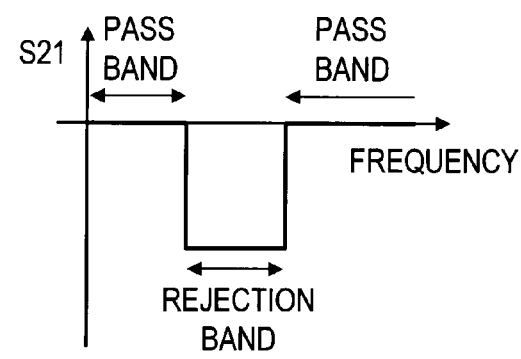
FIG. 10B is a view showing the characteristics of an ideal band elimination filter.

The demultiplexer can be configured by providing, for example, band pass filters (BPFs) in parallel which pass only a signal of a predetermined frequency band or band elimination filters (BEFs) in parallel which eliminate the passage of a signal of a predetermined frequency band. Further, the demultiplexer can be configured by providing in parallel combinations of band pass filters and band elimination filters. FIG. 10A shows the characteristics of an ideal band pass filter and FIG. 10B shows the characteristics of an ideal band elimination filter.

Figure 11:
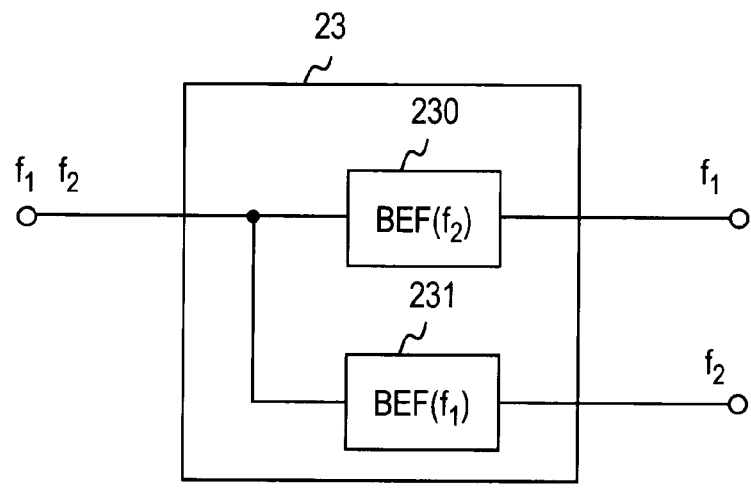
FIG. 11 is a view showing a configuration and a function when the demultiplexer is made up of the band elimination filter.

FIG. 11 shows an example of a demultiplexer 23 using band elimination filters (hereinafter, will be referred to as BEFs). A BEF 230 is designed such that the frequency band $f_2$ is a rejection band. Conversely, a BEF 231 is designed such that the frequency band $f_1$ is a rejection band. When a combined signal of the signal of the frequency band $f_1$ and the signal of the frequency band $f_2$ is inputted to the BEF 230 and the BEF 231, the BEF 230 outputs the signal of the frequency band $f_1$ because of the setting of the rejection band. The BEF 231 outputs the signal of the frequency band $f_2$.

Figure 12:
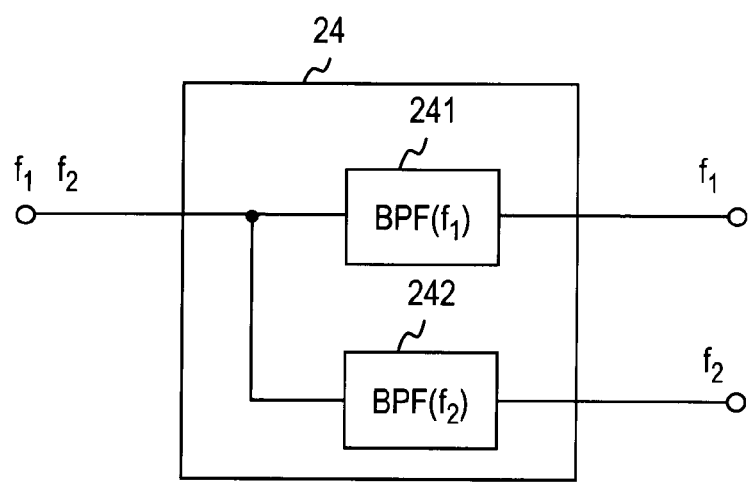
FIG. 12 is a view showing a configuration and a function when the demultiplexer is made up of the band pass filter.

FIG. 12 shows an example of a demultiplexer 24 using band pass filters (hereinafter, will be referred to as BPFs). A BPF 241 is designed such that the frequency band $f_1$ is a pass band. Conversely, a BPF 242 is designed such that the frequency band $f_2$ is a pass band. When a combined signal of the signal of the frequency band $f_1$ and the signal of the frequency band $f_2$ is inputted to the BPF 241 and the BPF 242, the BPF 241 outputs the signal of the frequency band $f_1$ because of the setting of the pass band. The BPF 242 outputs the signal of the frequency band $f_2$.

In FIGS. 11 and 12, in some combinations of the frequency band $f_1$ and the frequency band $f_2$, it is difficult to design filters such that the signal of one of the frequency bands is reflected and the signal of the other frequency band is passed. In this case, instead of disposing the BPFs or the BEFs in parallel, the BPF and the BEF are cascade-connected, so that the filters can be easily designed.

Figure 13:
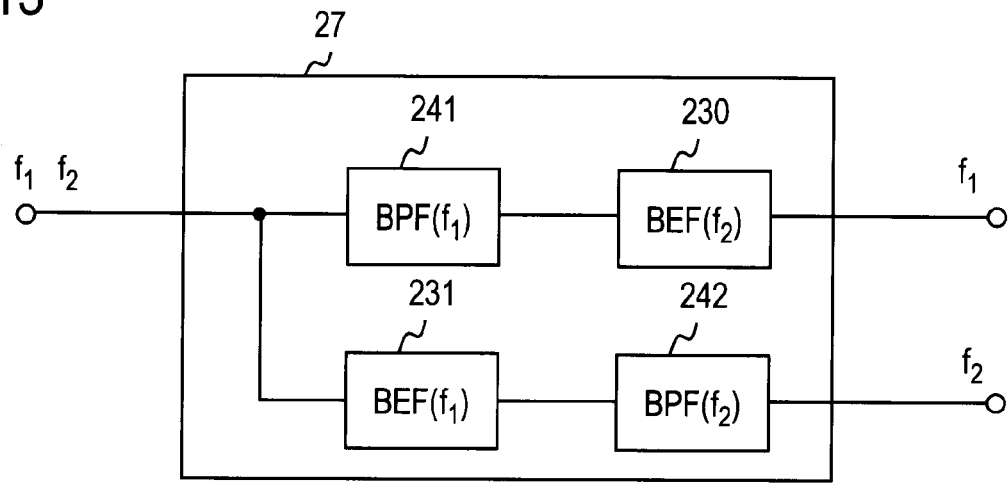
FIG. 13 is a view showing a configuration and a function when the demultiplexer is made up of a combined filter of the band pass filter and the band elimination filter.

FIG. 13 shows an example of a demultiplexer 27 using filters having cascade-connected BPFs and BEFs. A signal inputted to the demultiplexer 27 is inputted to a filter including a BPF 241 and a BEF 230 and a filter including a BEF 231 and a BPF 242. The pass band and the rejection band are set as described above, and thus the filter including the BPF 241 and the BEF 230 outputs the signal of the frequency band $f_1$. The filter including the BEF 231 and the BPF 242 outputs the signal of the frequency band $f_2$. In FIG. 13, the order of connection of the BPF and the BEF is not particularly significant. Further, a filter having at least two cascade-connected BPFs and BEFs may be used as necessary.

<Filter>

Figure 14:
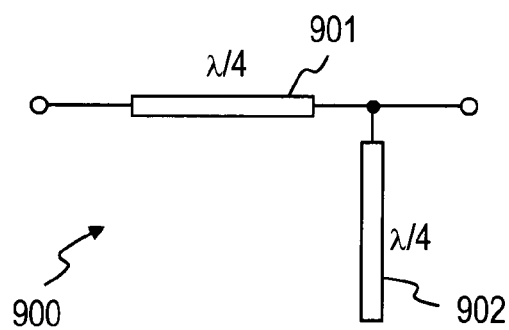
FIG. 14 is a view showing the configuration of the band elimination filter.

FIG. 14 shows a structural example of the filter. In FIG. 14, a filter 900 is a BEF made up of a transmission line 901 having a length equal to a quarter of a wavelength λ of a frequency to be rejected and an end open line 902 which is connected to one end of the transmission line and has a length equal to a quarter of the wavelength λ.

Figure 15:
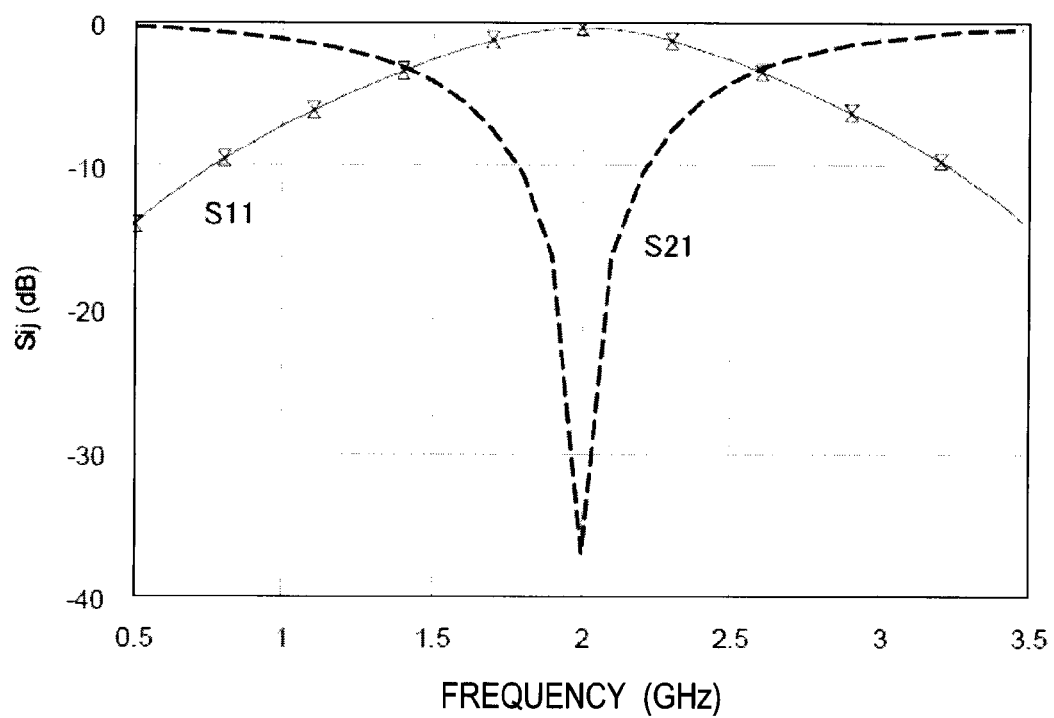
FIG. 15 is a view showing the frequency characteristics of a filter 900.

FIG. 15 shows the frequency characteristics of the filter 900. FIG. 15 shows a reflection coefficient S11 and a transmission coefficient S21 when 2 GHz is selected as a frequency to be rejected and the line length is λ/4. A signal incident from a port 1 at the set frequency (2 GHz) is reflected without being transmitted to a port 2.

The transmission line can be made up of, for example, a microstrip line or a coplanar line. Further, the filter may be configured by grounding through a series resonant circuit made up of lumped elements. The filter may have any given configuration according to a filtering theory.

Figure 16:
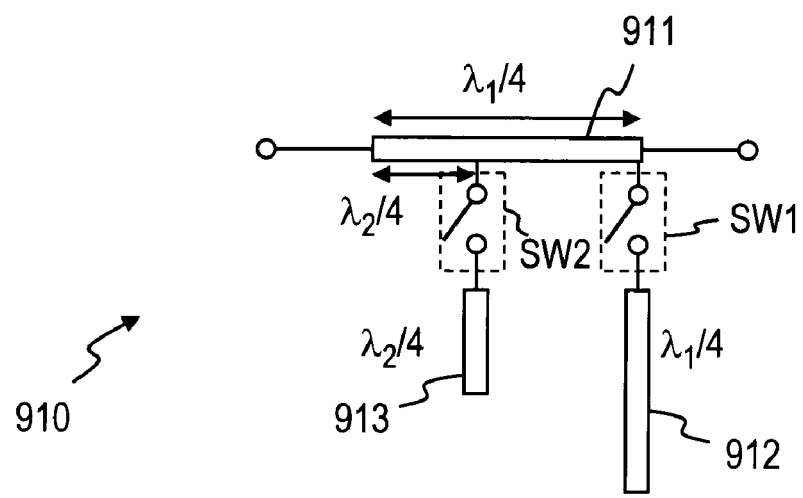
FIG. 16 is a view showing a two-band filter using switching devices.

The filter of FIG. 14 can be easily configured for multiple bands. FIG. 16 shows a two-band filter 910 using switching devices.

The two-band filter 910 is made up of a transmission line 911, an open-end line 912, and an open-end line 913. When frequencies $F_1$ and $F_2$ have wavelengths $\lambda_1$ and $\lambda_2$, respectively, the lines have lengths shown in FIG. 16. To be specific, the length of the open-end line 912 is $\lambda_1/4$, a length from the end of the transmission line on the signal input side to a portion connected to the open-end line 912 is $\lambda_1/4$, the length of the open-end line 913 is $\lambda_2/4$, and a length from the end of the transmission line on the signal input side to a portion connected to the open-end line 913 is $\lambda_2/4$. A switching device SW1 is provided between the transmission line 911 and the open-end line 912. A switching device SW2 is provided between the transmission line 911 and the open-end line 913. By switching these switching devices, it is possible to switch connections between the transmission line 911 and the open-end lines.

When the switching device SW1 is turned on, the frequency $F_1$ is a rejection frequency. When the switching device SW2 is turned on, the frequency $F_2$ is a rejection frequency.

The two-band filter 910 can be used as the frequency-variable filters 28 and 29 of the multi-band amplifier 105 shown in FIG. 6.

The two-band filter 910 can be easily expanded for two bands or more. For example, when a frequency $F_i$ to be rejected has a wavelength of $\lambda_i$, an open-end line having a length of $\lambda_i/4$ is disposed at a distance of $\lambda_i/4$ from the end of the transmission line on the signal input side. This arrangement is used for each frequency $F_i$ to be rejected, so that the filter can be configured for multiple bands.

When a variable capacitor is disposed on one end of the open-end line on the side not connected to the transmission line, frequency to be rejected can be finely adjusted by changing the value of the variable capacitor.

Further, with a single amplification device, the matching circuits may be switched using a switch with one input and multiple outputs. However, in the case of a large frequency difference and a large number of switching systems, it is generally difficult to obtain compatibility between a preferable insertion loss and isolation characteristics of the switch, resulting in difficulty in achieving an efficient switch.

When a demultiplexer of elimination type is used instead of a switch as in the present invention, a power loss is reduced as compared with the case where a switch is used. Thus an advantageous effect of a small circuit size can be obtained. This is because the demultiplexer of elimination type has a simple configuration and reduces the number of components. Moreover, even in the case of multiple bands, only a simple switch having one input and one output is basically used, achieving an efficient switch.

<Variable Matching Circuit>

Figure 17:
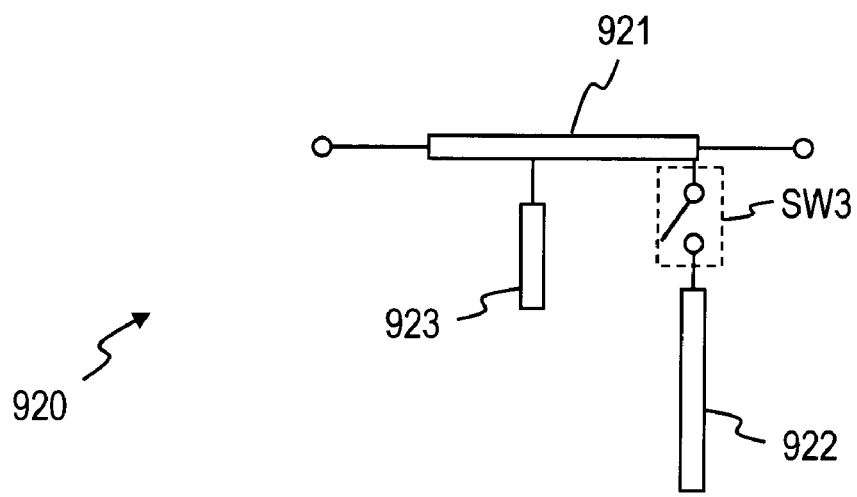
FIG. 17 is a view showing the configuration of a variable matching circuit.

FIG. 17 shows a structural example of a variable matching circuit having the function of changing a frequency. The variable matching circuit 920 shown in FIG. 17 is a variable matching circuit described in Non-patent document 2. For example, for the signals of the frequency $F_1$ and the frequency $F_2$, matching can be obtained between a target impedance and a system impedance by selecting on/off states of a switching device SW3. A variable matching circuit 920 is made up of a transmission line 921, an open-end line 922, and an open-end line 923. In FIG. 17, the variable matching circuit 920 becomes a matching circuit for the frequency $F_1$ when the switching device SW3 is turned off, and the variable matching circuit 920 becomes a matching circuit for the frequency $F_2$ when the switching device SW3 is turned on. The variable matching circuit 920 can be used as, for example, the matching blocks 33 and 34 of the multi-band amplifier 105 shown in FIG. 6. Further, the variable matching circuit 920 can be easily expanded for two or more bands (e.g., see Non-patent document 2).

Second Embodiment

In the first embodiment, the matching circuits and the multi-band amplifiers are disposed on the output side. A similar matching circuit may be used on the input side of a multi-band amplifier. By disposing the matching circuit of the present invention on the input side, an amplifier can be designed with high efficiency. In the following explanation, the same parts as those of the first embodiment are indicated by the same reference numerals and the explanation thereof is omitted.

Figure 18:
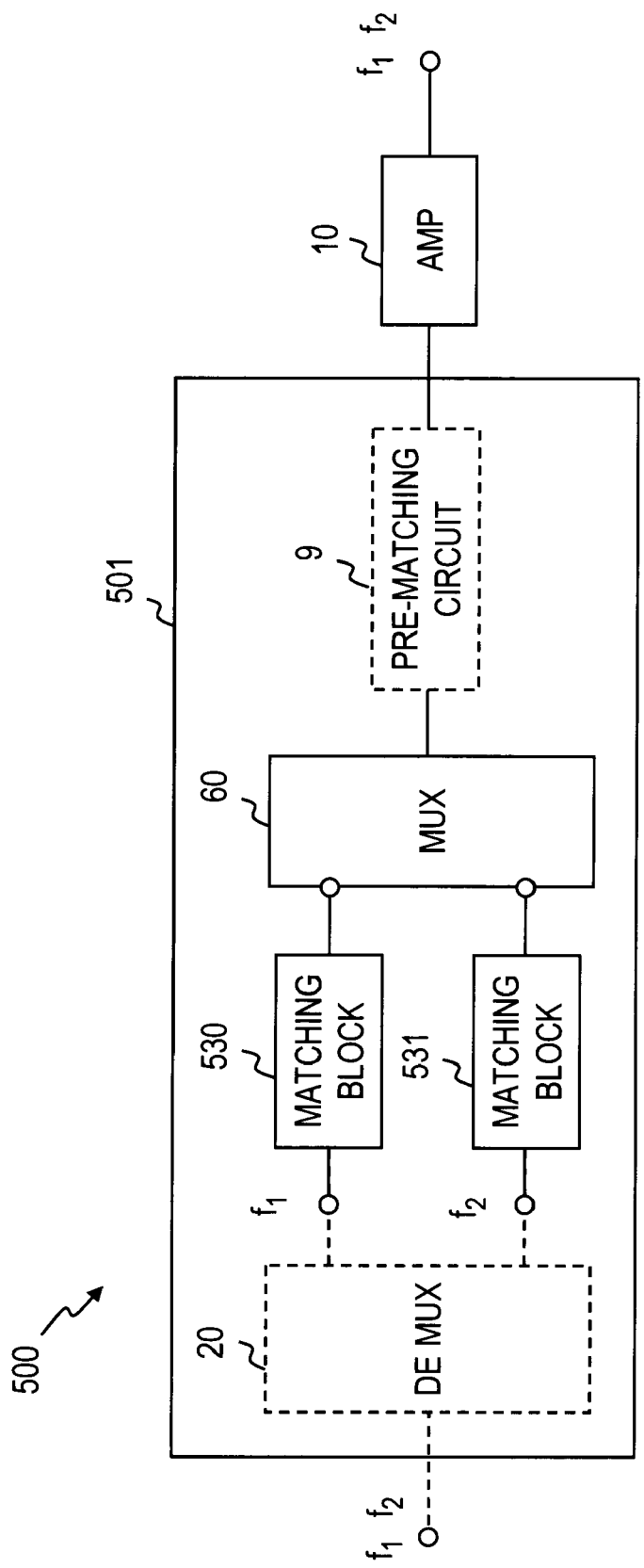
FIG. 18 is a view showing the function and configuration of a multi-band amplifier 500 according to a second embodiment.

FIG. 18 shows an example of a multi-band amplifier in which the matching circuit of the first embodiment is used on the input side of the multi-band amplifier. A multi-band amplifier 500 shown in FIG. 18 amplifies the signals of two frequency bands $f_1$ and $f_2$. The multi-band amplifier 500 is made up of an amplification device 10 and a matching circuit 501. The matching circuit 501 includes, for example, a multiplexer 60, a matching block 530, and a matching block 531.

Of the input signals of the frequency bands $f_1$ and $f_2$ to the multi-band amplifier 500, the signal of the frequency band $f_1$ is inputted to the matching block 530 and the signal of the frequency band $f_2$ is inputted to the matching block 531. The matching block 530 matches a system impedance $Z_0$ and an impedance obtained for the signal of the frequency band $f_1$ with respect to the multiplexer 60, and outputs the signal to the multiplexer 60. The matching block 531 matches the system impedance $Z_0$ and an impedance obtained for the signal of the frequency band $f_2$ with respect to the multiplexer 60, and outputs the signal to the multiplexer 60.

The multiplexer 60 multiplexes the signals outputted from the matching blocks 530 and 531 and outputs, to the amplification device 10, a combined signal of the signal of the frequency band $f_1$ and the signal of the frequency band $f_2$.

In this case, the matching blocks 530 and 531 only have to achieve matching for the signals of the corresponding frequency bands. Further, the design of one of the matching blocks is not related to the configuration of the other matching block. Thus the matching blocks can be separately designed, so that the most suitable matching blocks can be configured for the respective frequency bands. It is therefore possible to achieve a design with high power and high efficiency in the frequency bands $f_1$ and $f_2$, so that the multi-band amplifier can be configured with high efficiency.

Even when the signals of the two frequency bands are simultaneously inputted, each of the matching blocks is fed only with the signal of the corresponding frequency band, thereby satisfying the same matching conditions in theory as in the case where the signal of one of the frequency bands is inputted.

The multi-band amplifier 500 of a second embodiment can be modified as the modifications of the multi-band amplifier of the first embodiment. For example, a configuration for multiple bands can be achieved by providing three or more matching blocks having different target impedances. Further, the multi-band amplifier 500 can be designed with one input and one output by providing a demultiplexer 20 in the matching circuit 501. The demultiplexer 20, the matching blocks, and the multiplexer may be provided with the function of changing a frequency. Furthermore, the output terminal of the multiplexer may be provided with a pre-matching circuit 9. These modifications may be combined.

Third Embodiment

Figure 19:
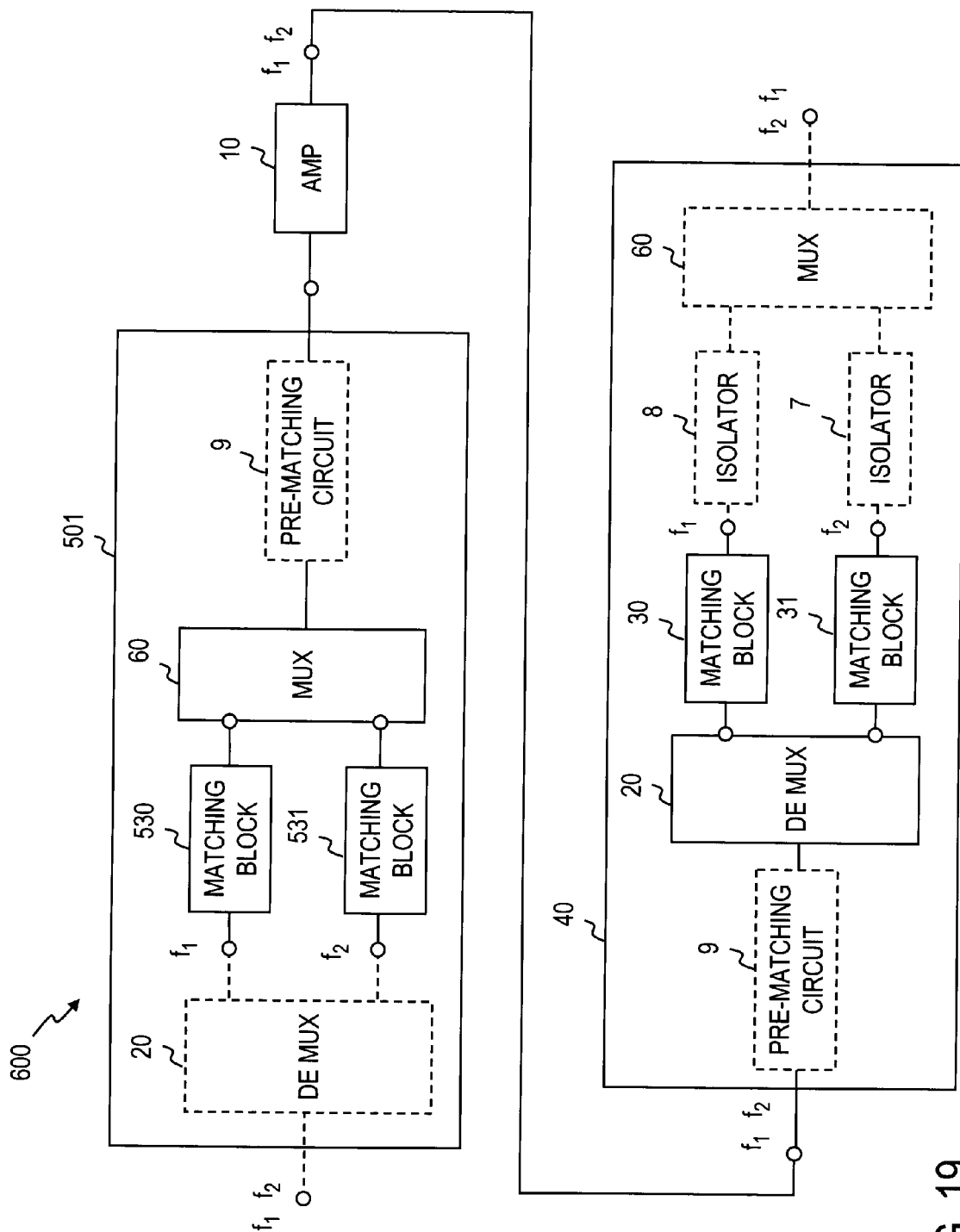
FIG. 19 is a view showing the function and configuration of a multi-band amplifier 600 according to a third embodiment.

A multi-band amplifier of a third embodiment is obtained by combining the matching circuit and the amplification device of the first embodiment and the matching circuit of the second embodiment. For example, a multi-band amplifier 600 shown in FIG. 19 includes a matching circuit 501 described in the second embodiment, the amplification device 10 for amplifying a signal outputted from the matching circuit 501, and the matching circuit 40 for performing, for each frequency band, impedance matching on a signal outputted from the amplification device 10 in the first embodiment.

The configurations and functions of the parts are similar to those of the first and second embodiments. Thus the same parts are indicated by the same reference numerals and the explanation thereof is omitted. As in the first and second embodiments, the matching circuit 501 and the matching circuit 40 can be configured for multiple bands and may include the demultiplexer 20, the multiplexer 60, the isolators 7 and 8, and the pre-matching circuit 9 as appropriate.

By disposing the matching circuits of the present invention on the input side and the output side, the multi-band amplifier can be designed with high efficiency, high power, and low noise.

Fourth Embodiment

A multi-band amplifier 1000 according to a fourth embodiment in FIG. 20 includes the two dual-system multi-band amplifiers (hereinafter, will be referred to as an amplifier 1002 and an amplifier 1003) described in the first embodiment and combining circuits 75 and 76 for combining the signal outputs of the same frequency band out of the outputs of the systems.

In this configuration, the amplifier 1002 has a high saturation output power and the amplifier 1003 has a low saturation output power. Generally, an amplifier can efficiently amplify a signal around the saturation output power and thus the efficiency decreases when, for example, a signal at a low output level is amplified by an amplifier having a high saturation output power. Therefore, in the multi-band amplifier 1000, a signal at a high output power level is amplified by the first amplifier 1002 and a signal at a low output power level is amplified by the second amplifier 1003. Thus efficient operations can be achieved at all output levels.

An output power level is detected by control means made up of a comparator 77, switches 72 and 73, and a power supply 78. The comparator 77 compares the power level of an input signal with a predetermined value. The input signal is divided by a divider 1004 and is inputted to the comparator 77. For example, the predetermined value is set beforehand at a value between the saturation output powers of the amplifiers 1002 and 1003.

When the power level of the input signal is higher than the predetermined value, the comparator 77 turns on the switch 72 and turns off the switch 73. Thus the power of the power supply 78 is supplied to the amplification device 10 of the amplifier 1002 to operate the amplifier 1002. When the predetermined value is lower than the power level of the input signal, the comparator 77 turns on the switch 73 and turns off the switch 72. Thus the power of the power supply 78 is supplied to the amplification device 10 of the amplifier 1003 to operate the amplifier 1003.

In this configuration, the amplifiers 1002 and 1003 each include output terminals of two systems for the respective frequency bands, and the combining circuits 75 and 76 combine signals of the same frequency bands out of signals outputted from the amplifiers. To be specific, the signals of a frequency band $f_1$ from the matching block 30 of the amplifier 1002 and the matching block 30 of the amplifier 1003 are combined and outputted by the combining circuit 75, and the signals of a frequency band $f_2$ from the matching block 30 of the amplifier 1002 and the matching block 31 of the amplifier 1003 are combined and outputted by the combining circuit 76. In this case, the combining circuit 75 is designed for each frequency band.

Since the different amplifiers are turned on according to the output levels, the output impedances of the amplifiers also fluctuate. In this case, the combining circuits 75 and 76 are designed in consideration of the output impedances of the amplifiers 1002 and 1003.

Figure 20:
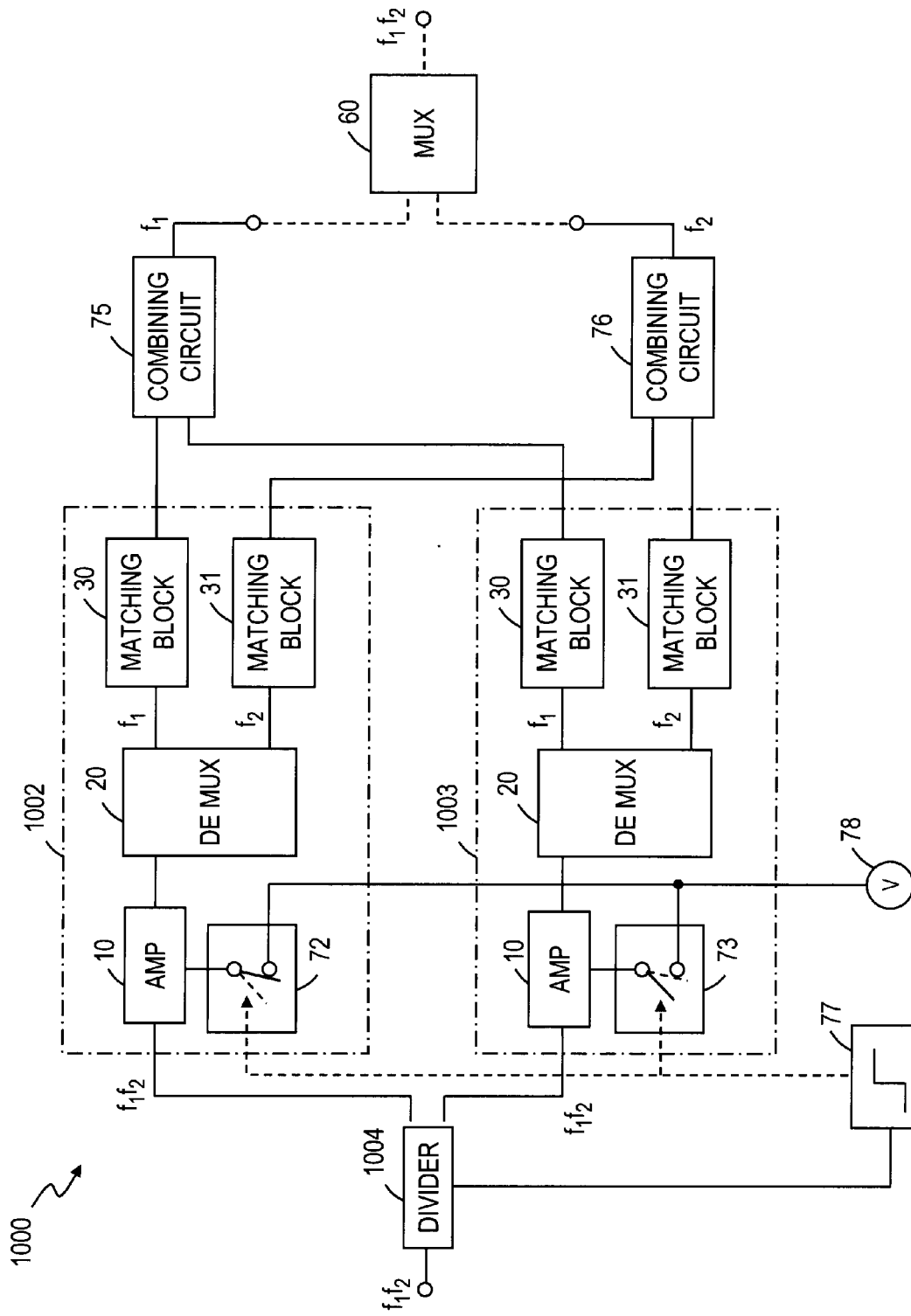
FIG. 20 is a view showing the function and configuration of a multi-band amplifier 1000 according to a fourth embodiment.

As indicated by a broken line in FIG. 20, a multiplexer 60 may be provided for multiplexing the signal of the frequency band $f_1$ from the combining circuit 75 and the signal of the frequency band $f_2$ from the combining circuit 76 and outputting a multiplexed signal.

Further, as in the first and second embodiments, the amplifier 1002 and the amplifier 1003 can be configured for multiple bands and may include the demultiplexer 20, the multiplexer 60, the isolators 7 and 8, and the pre-matching circuit 9 as appropriate.

Moreover, two or more amplifiers having different saturation output powers may be provided and control means may be provided for selecting one of the two or more amplifiers according to the power of an inputted signal and driving only the selected amplifier. For example, based on a plurality of predetermined threshold values, the control means selects one of the amplifiers according to the power of the inputted signal. For example, when N amplifiers $A_n$ (n=1, ... N) having different saturation output powers are used, N−1 different threshold values $a_n$ (n=1, ... , N−1) are prepared. Control can be performed such that an amplifier $A_1$ is used when the input signal has a power $W<a_1$, an amplifier $A_k$ is used for $a_{k-1}<W<a_k$ where k=2, ... , N−1, and an amplifier $A_N$ is used for $a_{N-1}<W$. The threshold value $a_n$ can be set as appropriate.

In the multi-band amplifier 1000 of FIG. 20, the amplifiers 1002 and 1003 are the output-side multi-band amplifiers described in the first embodiment. The amplifiers 1002 and 1003 may be the input-side multi-band amplifier 500 described in the second embodiment with reference to FIG. 18 or the multi-band amplifier 600 described in the third embodiment with reference to FIG. 19. When the input-side multi-band amplifier 500 described in the second embodiment is used as the amplifiers 1002 and 1003, it is preferable that a signal outputted from the divider 1004 is inputted to the demultiplexers of the multi-band amplifiers 500 and signals outputted from the amplification devices 10 (see FIG. 18) of the multi-band amplifiers 500 are combined by one of the combining circuits 75 and 76.

In this way, the two or more amplifiers having different saturation output powers are provided and the most suitable amplifier is selected according to the power of an inputted signal, so that a multi-band amplifier can be designed with higher efficiency and higher power.

Fifth Embodiment

A plurality of dividers, a plurality of amplifiers according to the present invention, and a plurality of combiners are cascade-connected, so that a signal of each frequency is divided into multiple signals by dividers designed for corresponding frequencies, the divided signals are amplified by the amplifiers of respective systems, and the amplified signals are combined by combiners designed for the corresponding frequencies. As examples of an amplifier achieved with this configuration, a multi-port amplifier and a Doherty amplifier will now be described. The multi-port amplifier will now be discussed as a fifth embodiment. The Doherty amplifier will be described later.

Figure 21:
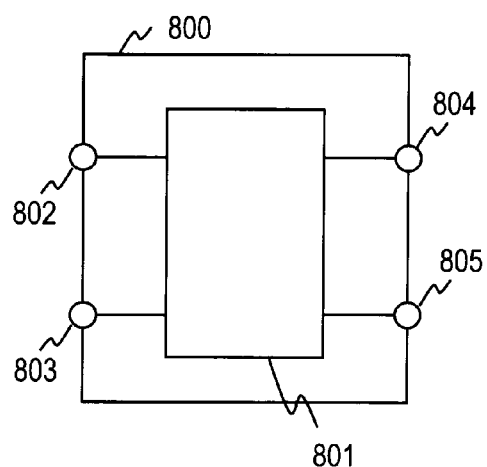
FIG. 21 is a view showing the function and configuration of a Butler matrix.

First, a Butler matrix used as a divider and a combiner in the multi-port amplifier will be described below. The simplest Butler matrix includes, for example, a 90 degree hybrid. FIG. 21 illustrates the configuration of the 90 degree hybrid. A 90 degree hybrid 801 is a circuit having four ports (ports 802 to 805). A signal inputted from the port 802 passes through the 90 degree hybrid 801, so that the signal is equally divided with a 90-degree phase difference and is outputted to the port 804 and the port 805. Similarly, a signal inputted from the port 803 passes through the 90 degree hybrid 801, so that the signal is equally divided with a 90-degree phase difference and is outputted to the port 804 and the port 805.

Figure 22:
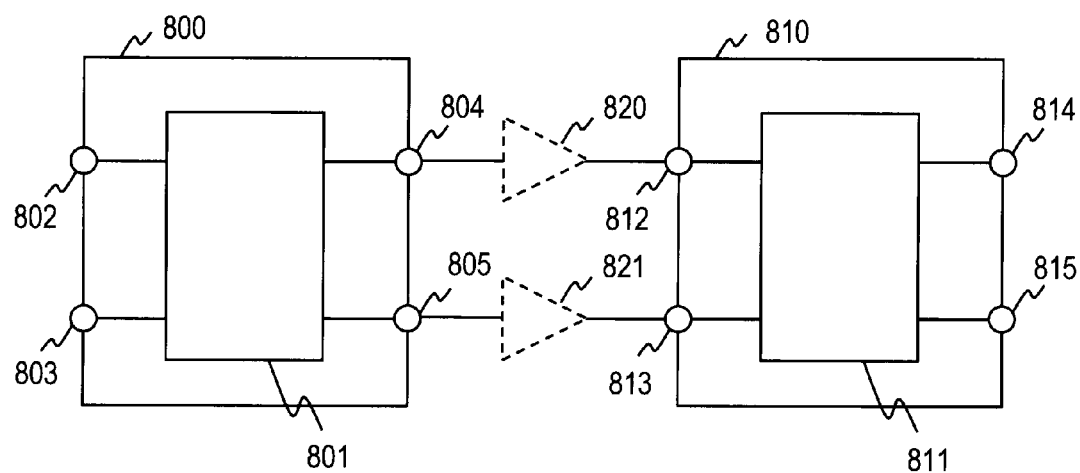
FIG. 22 is a view showing a structural example of a multi-port amplifier using the Butler matrixes.

FIG. 22 shows that a similar Butler matrix 810 is connected to the port 804 and the port 805. A signal outputted from the port 804 is inputted to a port 812 and is outputted to a port 814 and a port 815. Similarly, a signal outputted from the port 805 is inputted to a port 813 and is outputted to the port 814 and the port 815. In this case, the input signal to the port 803 is transmitted to the port 814 without a loss and the input signal to the port 802 is transmitted to the port 815 without a loss.

In the configuration of a typical multi-port amplifier, as indicated by broken lines in FIG. 22, unit amplifiers 820 and 821 having the same characteristics are connected between the port 804 and the port 812 and between the port 805 and the port 813, respectively. In a Butler matrix 800, even when signal powers inputted to the port 802 and the port 803 are different, input powers to the unit amplifiers are equalized, that is, signal powers on the port 804 and the port 805 are equalized.

Figure 23:
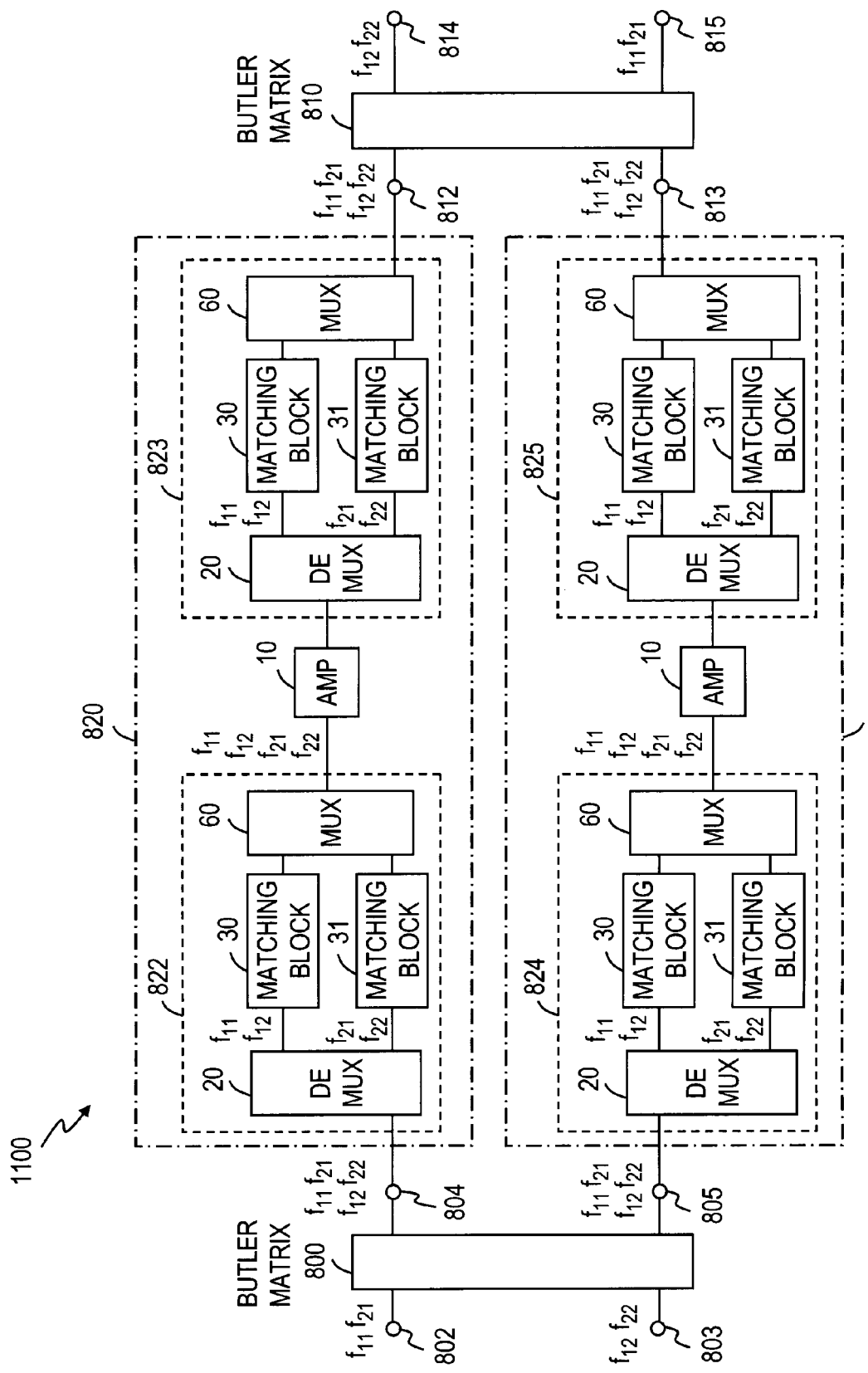
FIG. 23 is a view showing the function and configuration of a multi-port multi-band amplifier 1100 according to a fifth embodiment.

By using the multi-band amplifier of the present invention as the unit amplifiers 820 and 821 indicated by the broken lines in FIG. 22, a multi-port amplifier for multiple bands can be configured. To be specific, as shown in FIG. 23, two multi-band amplifiers including the demultiplexers 20 and the multiplexers 60 according to the third embodiment are respectively provided as the unit amplifier 820 and the unit amplifier 821 between the Butler matrix 800 and the Butler matrix 810. The configurations and functions of the parts of the unit amplifiers 820 and 821 are similar to those described above. Thus the same parts are indicated by the same reference numerals and the explanation thereof is omitted.

The port 802 of the Butler matrix 800 in a multi-port multi-band amplifier 1100 is fed with a combined signal (hereinafter, will be referred to as a signal $f_{11}f_{21}$) of the signal of a frequency band $f_1$ (hereinafter, will be referred to as a signal $f_{11}$) and the signal of a frequency band $f_2$ (hereinafter, will be referred to as a signal $f_{21}$), and the port 803 is fed with a combined signal (hereinafter, will be referred to as a signal $f_{12}f_{22}$) of the signal of the frequency band $f_1$ (hereinafter, will be referred to as a signal $f_{12}$) and the signal of the frequency band $f_2$ (hereinafter, will be referred to as a signal $f_{22}$).

According to the characteristics of the Butler matrix, a combined signal $f_{11}f_{21}f_{12}f_{22}$ (first signal) of the signal $f_{11}f_{21}$ having been shifted in phase by 90 degrees and the signal $f_{12}f_{22}$ is outputted from the port 804 (first output terminal) of the Butler matrix 800. Further, a combined signal $f_{11}f_{21}f_{12}f_{22}$ (second signal) of the signal $f_{11}f_{21}$ and the signal $f_{12}f_{22}$ having been shifted in phase by 90 degrees is outputted from the port 805 (second output terminal).

The unit amplifier 820 amplifies the first input signal $f_{11}f_{21}f_{12}f_{22}$ and outputs the amplified signal to the port 812 of the Butler matrix 810. The unit amplifier 821 amplifies the second input signal $f_{11}f_{21}f_{12}f_{22}$ and outputs the amplified signal to the port 813 of the Butler matrix 810.

From the Butler matrix 810 fed with the first amplified signal $f_{11}f_{21}f_{12}f_{22}$ from the port 812 and the second amplified signal $f_{11}f_{21}f_{12}f_{22}$ from the port 813, the signal $f_{12}f_{22}$ is outputted to the port 814 and the signal $f_{11}f_{21}$ is outputted to the port 815.

The unit amplifiers 820 and 821 can be configured for multiple bands by the same methods as those of the first to third embodiments and may include pre-matching circuits, isolators, and the function of changing a frequency.

A Butler matrix usable in the present embodiment is not limited to a matrix with two inputs and two outputs. The present embodiment is applicable to a Butler matrix having B input ports and B output ports where B represents an integer not smaller than 3. For example, in the case of B output ports, it is preferable that unit amplifiers are provided in parallel as many as the B output ports, between an input-side Butler matrix and an output-side Butler matrix.

Sixth Embodiment

Figure 24:
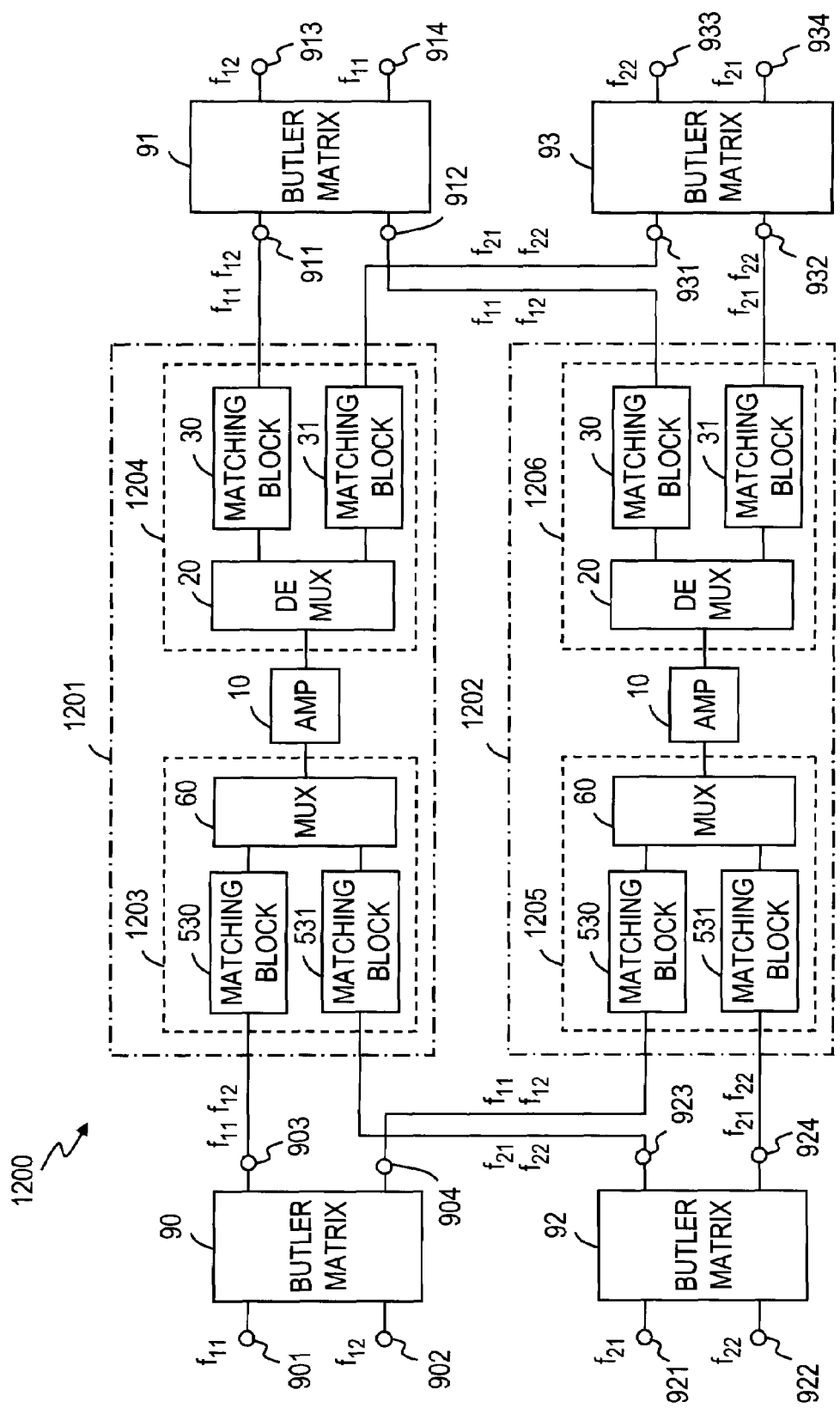
FIG. 24 is a view showing the function and configuration of a multi-port multi-band amplifier 1200 according to a sixth embodiment.

An actual Butler matrix including a 90 degree hybrid has frequency characteristics. In this case, the Butler matrix exerts the foregoing effect only at a design frequency. Thus as shown in FIG. 24, Butler matrixes 90 and 91 (92, 93) designed to efficiently operate in each frequency band are used as a divider and combiner and the multi-band amplifier 1201 and the amplifier 1202 of the third embodiment are used, so that the amplifier 1201 and the amplifier 1202 can be shared in multiple frequency bands. Thus a multi-port and multi-band amplifier can be achieved with a small size.

The Butler matrixes 90 and 91 are designed to efficiently operate in a frequency band $f_1$ and the Butler matrixes 92 and 93 are designed to efficiently operate in a frequency band $f_2$.

The Butler matrix 90 combines a signal $f_{11}$ of the frequency band $f_1$ from a port 901 and a signal $f_{12}$ of the frequency band $f_1$ from a port 902 through a 90 degree hybrid, and outputs a first signal $f_{11}f_{12}$ from a port 903 (first output terminal). Further, the Butler matrix 90 outputs a second signal $f_{11}f_{12}$ from a port 904 (second output terminal). Likewise, the Butler matrix 92 combines a signal $f_{21}$ of the frequency band $f_2$ from a port 921 and a signal $f_{22}$ of the frequency band $f_2$ from a port 922 through a 90 degree hybrid, and outputs a first signal $f_{21}f_{22}$ from a port 923 (first output terminal). Further, the Butler matrix 90 outputs a second signal $f_{21}f_{22}$ from a port 924 (second output terminal).

The first signal $f_{11}f_{12}$ and the first signal $f_{21}f_{22}$ that are respectively outputted from the Butler matrixes 90 and 92 are inputted to a matching circuit 1203 of the amplifier 1201. The second signal $f_{11}f_{12}$ and the second signal $f_{21}f_{22}$ that are outputted from the Butler matrixes 90 and 92 are inputted to a matching circuit 1205 of the amplifier 1202.

The amplifiers 1201 and 1202 amplify the inputted signals $f_{11}f_{12}$ and $f_{21}f_{22}$ and output signals of the respective frequency bands. The functions, configurations, and processing of the parts of the amplifiers 1201 and 1202 are similar to those of the first to third embodiments and thus the explanation thereof is omitted.

The Butler matrix 91 is fed with the signal $f_{11}f_{12}$ of the frequency band $f_1$ from a matching circuit 1204 of the amplifier 1201 and the signal $f_{11}f_{12}$ of the frequency band $f_1$ from a matching circuit 1206 of the amplifier 1202. The Butler matrix 93 is fed with the signal $f_{21}f_{22}$ of the frequency band $f_2$ from the matching circuit 1204 of the amplifier 1201 and the signal $f_{21}f_{22}$ of the frequency band $f_2$ from the matching circuit 1206 of the amplifier 1202. In other words, each of the Butler matrixes is fed with the signals of the same frequency band out of the signals outputted from the matching circuits of the respective amplifiers (that is, the respective matching circuits).

The Butler matrix 91 outputs the inputted signal through a 90 degree hybrid, so that the signal $f_{12}$ is outputted from a port 913 and the signal $f_{11}$ is outputted from a port 914. The Butler matrix 93 outputs the inputted signal through a 90 degree hybrid, so that the signal $f_{22}$ is outputted from a port 933 and the signal $f_{21}$ is outputted from a port 934.

The amplifiers 1201 and 1202 can be configured for multiple ports by the same methods as those of the first to third embodiments and may include pre-matching circuits, isolators, and the function of changing a frequency.

A Butler matrix usable in the present embodiment is not limited to a matrix with two inputs and two outputs. The present embodiment is also applicable to a Butler matrix having B input ports and B output ports where B represents a natural number not smaller than 3. For example, in the case of B output ports, it is preferable that the amplifiers of the third embodiment are provided in parallel as many as the B output ports, between an input-side Butler matrix and an output-side Butler matrix. In this case, as in the foregoing embodiments, the first signals outputted from the input-side Butler matrixes are inputted to the same amplifier and the second signals outputted from the input-side Butler matrixes are inputted to the other amplifier. The third and subsequent signals are inputted in a similar manner. Further, of the signals outputted from the amplifiers, the signals of the same frequency band are inputted to the same output-side Butler matrix in the above manner.

When increasing the number of frequency bands to be amplified, it is preferable that the input side Butler matrixes and the output-side Butler matrixes are provided as many as the frequency bands. In this case, it is necessary to increase the number of matching blocks in each amplifier with the number of frequency bands.

Seventh Embodiment

In a seventh embodiment, the matching circuit and the multi-band amplifier of the present invention are applied to a Doherty amplifier.

Figure 25:
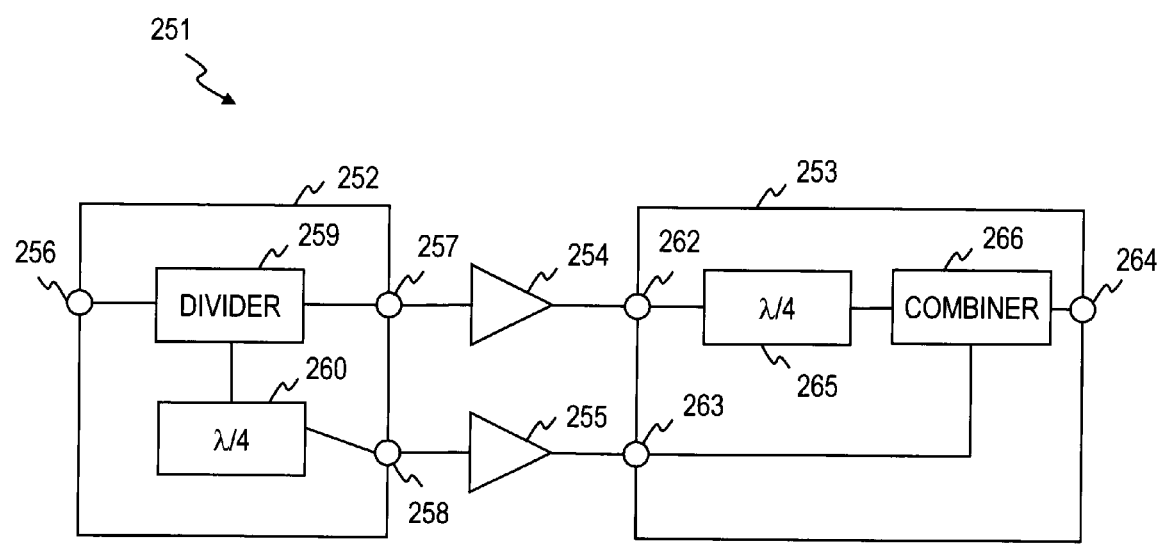
FIG. 25 is a view showing the function and configuration of a typical Doherty amplifier 251.

FIG. 25 shows a structural example of a typical Doherty amplifier 251. The Doherty amplifier 251 includes, for example, an input-side Doherty network 252, an output-side Doherty network 253, a carrier amplifier 254, and a peak amplifier 255.

The input-side Doherty network 252 includes one input terminal (port 256) and two output terminals (ports 257 and 258). Further, the input-side Doherty network 252 includes a divider 259 which divides a signal inputted from the port 256 and outputs the divided signals respectively to the port 257 and the port 258 and a λ/4 wavelength line 260 which is disposed between the divider 259 and the port 258 and shifts by 90 degrees the phase of the signal to be outputted to the port 258.

The output-side Doherty network 253 includes two input terminals (ports 262 and 263) and one output terminal (port 264). Further, the output-side Doherty network 253 includes a combiner 266 which combines a signal inputted from the port 262 and a signal inputted from the port 263 and a λ/4 wavelength line 265 which is disposed between the combiner 266 and the port 262, shifts by 90 degrees the phase of the signal inputted from the port 262, and outputs the signal to the combiner 266.

The carrier amplifier 254 is disposed between the port 257 and the port 262. The carrier amplifier 254 is biased to, for example, class F.

The peak amplifier 255 is disposed between the port 258 and the port 263. The peak amplifier 255 is biased to, for example, class C.

A signal inputted from the port 256 to the input-side Doherty network 252 is divided to two paths by the divider 259. One of the divided signals is outputted from the port 257 and is amplified by the carrier amplifier 254. The other signal passes through the λ/4 wavelength line 260, so that the signal is shifted in phase by 90 degrees from the signal outputted from the port 257. After that, the signal is outputted from the port 258 and is amplified by the peak amplifier 255.

The signal amplified by the carrier amplifier 254 is inputted to the output-side Doherty network 253 from the port 262 and passes through the λ/4 wavelength line 265, so that the signal is shifted in phase by 90 degrees from the signal amplified by the peak amplifier 255 and is outputted to the combiner 266. The signal amplified by the peak amplifier 255 is inputted from the port 263 to the output-side Doherty network 253 and is outputted to the combiner 266. The combiner 266 combines the two amplified input signals.

As long as the input signal is present, the carrier amplifier 254 amplifies and outputs the signal. In other words, even in the case of a small instantaneous input signal, the signal is amplified and outputted.

The peak amplifier 255 is biased to class C. In the case of a small instantaneous input signal, the input level is not high enough to turn on the peak amplifier 255. Thus the peak amplifier 255 is turned off and does not output any signals. Since the DC power consumption of the peak amplifier 255 is sufficiently low, the overall Doherty amplifier 251 has high efficiency. In the case of a large instantaneous input signal, not only the carrier amplifier 254 but also the peak amplifier 255 are turned on, so that the peak amplifier 255 also amplifies and outputs a signal.

In other words, in the Doherty amplifier 251, the peak amplifier 255 operates when the input signal has a high power, so that the two output powers of the carrier amplifier 254 and the peak amplifier 255 are combined to increase a saturation power and an apparent load impedance applied to the carrier amplifier 254 fluctuates with the power of the input signal. Thus efficient operations can be achieved.

In this case, the λ/4 wavelength lines 260 and 265 of the Doherty amplifier 251 have frequency characteristics and the above effect can be obtained in theory only at a frequency having a wavelength λ. Thus as shown in FIG. 26, input-side Doherty networks 2521 and 2522 designed for the respective frequency bands are used as dividers, output-side Doherty networks 2531 and 2532 designed for the respective frequency bands are used as combiners, and the multi-band amplifiers of the third embodiment are connected in parallel as a carrier amplifier 1301 and a peak amplifier 1302 between the input-side Doherty network and the output-side Doherty network, so that a Doherty multi-band amplifier 1300 can be configured with a small size.

Figure 26:
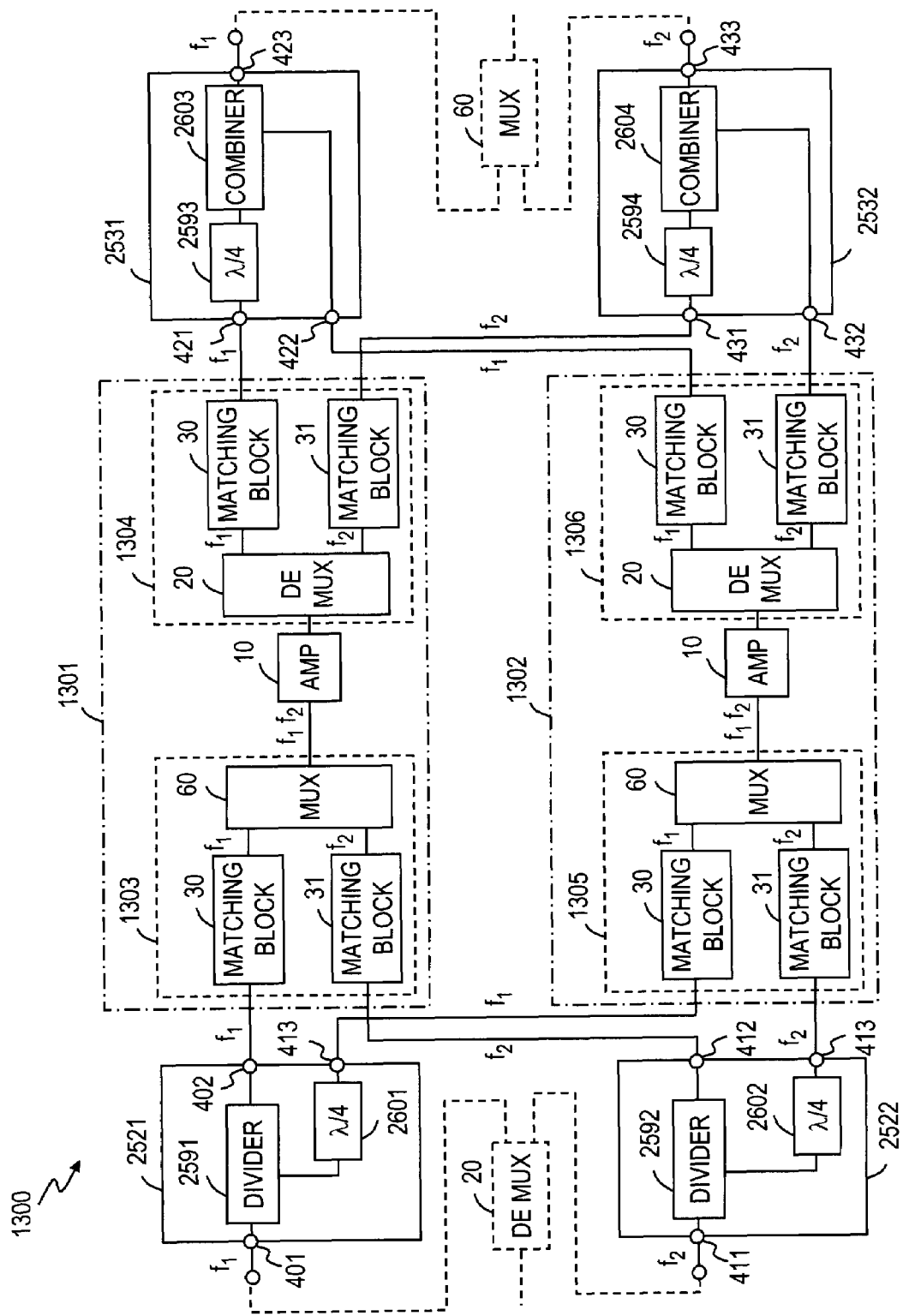
FIG. 26 is a view showing the function and configuration of a Doherty multi-band amplifier 1300 according to a seventh embodiment.

The Doherty network multi-band amplifier 1300 shown in FIG. 26 includes the input-side Doherty network 2521, the input-side Doherty network 2522, the output-side Doherty network 2531, the output-side Doherty network 2532, the carrier amplifier 1301, and the peak amplifier 1302.

The input-side Doherty network 2521 includes a port 401 to which the signal of a frequency band $f_1$ is inputted, a divider 2591 which divides the signal inputted from the port 401 to two paths and outputs the divided signals respectively to a port 402 and a port 403, and a λ/4 wavelength line 2601 which is provided between the divider 2591 and the port 403 and shifts the phase of a passed signal by 90 degrees. Of the divided signals, the signal outputted from the port 402 is used as a first signal and the signal outputted from the port 403 is used as a second signal.

The input-side Doherty network 2522 includes a port 411 to which the signal of a frequency band $f_2$ is inputted, a divider 2592 which divides the signal inputted from the port 411 to two paths and outputs the divided signals respectively to a port 412 and a port 413, and a λ/4 wavelength line 2602 which is provided between the divider 2592 and the port 413 and shifts the phase of a passed signal by 90 degrees. Of the divided signals, the signal outputted from the port 412 is used as a first signal and the signal outputted from the port 413 is used as a second signal.

The first signal outputted from the port 402 of the input-side Doherty network 2521 and the first signal outputted from the port 412 of the input-side Doherty network 2522 are inputted to a matching circuit 1303 of the carrier amplifier 1301. In other words, the first signals outputted from the input-side Doherty networks are inputted to the matching circuit 1303 of the carrier amplifier 1301.

The second signal outputted from the port 403 of the input-side Doherty network 2521 and the second signal outputted from the port 413 of the input-side Doherty network 2522 are inputted to a matching circuit 1305 of the peak amplifier 1302. In other words, the second signals outputted from the input-side Doherty networks are inputted to the matching circuit 1305 of the peak amplifier 1302.

The carrier amplifier 1301 is biased to, for example, class F. The carrier amplifier 1301 amplifies the first signal (the signal of the frequency band $f_1$) outputted from the input-side Doherty network 2521 and the first signal (the signal of the frequency band $f_2$) outputted from the input-side Doherty network 2522 and outputs the signals for the respective frequency bands. To be specific, a matching block 30 of a matching circuit 1304 in the carrier amplifier 1301 outputs the signal of the frequency band $f_1$, and a matching block 31 of the matching circuit 1304 in the carrier amplifier 1301 outputs the signal of the frequency band $f_2$. The functions, configurations, and processing of the carrier amplifier 1301 are similar to those of the first to third embodiments and thus the explanation thereof is omitted.

The peak amplifier 1302 is biased to, for example, class C. The peak amplifier 1302 amplifies the second signal (the signal of the frequency band $f_1$) outputted from the input-side Doherty network 2521 and the second signal (the signal of the frequency band $f_2$) outputted from the input-side Doherty network 2522 and outputs the signals for the respective frequency bands. To be specific, a matching block 30 of a matching circuit 1306 in the peak amplifier 1302 outputs the signal of the frequency band $f_1$, and a matching block 31 of the matching circuit 1306 in the peak amplifier 1302 outputs the signal of the frequency band $f_2$. The functions and configurations of the peak amplifier 1302 are similar to those of the first to third embodiments and thus the explanation thereof is omitted.

The signal of the frequency band $f_1$ from the matching block 30 of the matching circuit 1304 in the carrier amplifier 1301 is inputted from a port 421 to the output-side Doherty network 2531. The signal of the frequency band $f_1$ from the matching block 30 of the matching circuit 1306 in the peak amplifier 1302 is inputted from a port 422 to the output-side Doherty network 2531. The signal of the frequency band $f_2$ from the matching block 31 of the matching circuit 1304 in the carrier amplifier 1301 is inputted from a port 431 to the output-side Doherty network 2532. The signal of the frequency band $f_2$ from the matching block 31 of the matching circuit 1306 in the peak amplifier 1302 is inputted from a port 432 to the output-side Doherty network 2532. In this way, of the signals outputted from the matching blocks on the output side of the amplifiers, the signals of the same frequency band are outputted to the same output-side Doherty network.

The output-side Doherty network 2531 has a λ/4 wavelength line 2593 and a combiner 2603. The combiner 2603 combines the signal of the frequency band $f_1$ from the port 422 and the signal of the frequency band $f_1$, the signal having been inputted from the port 421 and shifted in phase by 90 degrees through the λ/4 wavelength line 2593. And then, the combiner 2603 outputs the combined signal from a port 423.

The output-side Doherty network 2532 has a λ/4 wavelength line 2594 and a combiner 2604. The combiner 2604 combines the signal of the frequency band $f_2$ from the port 432 and the signal of the frequency band $f_2$, the signal having been inputted from the port 431 and shifted in phase by 90 degrees through the λ/4 wavelength line 2594. And then, the combiner 2604 outputs the combined signal from a port 433.

When increasing the number of frequency bands to be amplified, it is preferable that the input-side Doherty networks and the output-side Doherty networks are provided as many as the frequency bands. In this case, it is necessary to increase the number of matching blocks in the amplifiers with the number of frequency bands.

In this case, as in the foregoing embodiments, the first signals outputted from the input-side Doherty networks are inputted to the carrier amplifier and the second signals outputted from the input-side Doherty networks are inputted to the peak amplifier. Further, of the signals outputted from the amplifiers, the signals of the same frequency band are inputted to the same output-side Doherty network in the above manner.

The first signals may be inputted to the peak amplifier and the second signals may be inputted to the carrier amplifier.

In the Doherty multi-band amplifier 1300, when the input signal has a low power, the peak amplifier 1302 does not operate and thus the saturation power is low, whereas when the input signal has a high power, the peak amplifier 1302 operates and thus the saturation power increases. Therefore, the Doherty multi-band amplifier 1300 efficiently operates regardless of the power of the input signal.

The carrier amplifier 1301 and the peak amplifier 1302 can be configured for multiple bands by the same methods as those of the first to third embodiments and may include pre-matching circuits, isolators, and the function of changing a frequency.

Figure 27:
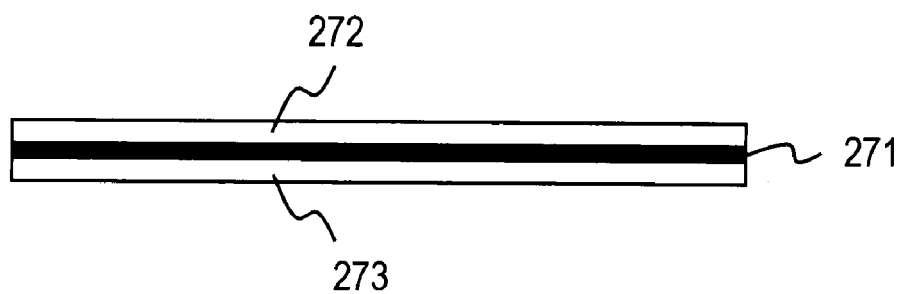
FIG. 27 is a view of a structural example in which dividers and combiners are configured in the layers of a multilayer board.

Since the plurality of Doherty networks designed for the respective frequency bands are used, the circuit size may become a problem. The circuit size can be reduced by, for example, disposing dividers and combiners in the layers of a multilayer board as shown in FIG. 27. In the example of FIG. 27, the divider and the combiner of the frequency band $f_1$ are provided in a first layer 272 formed on one of the surfaces of a ground layer 271 and the divider and the combiner of the frequency band $f_2$ are provided in a second layer 273 formed on the other surface of the ground layer 271.

Another Embodiment

As a matter of course, the matching circuit of the present invention is applicable to uses other than amplifiers. In other words, the matching circuit of the present invention is applicable to the overall circuit in which an impedance changes with a frequency.

Only signals of some of design frequency bands may be inputted to the matching circuit and the multi-band amplifier of the present invention. In other words, it is not necessary to input the signals of all the design frequency bands. For example, although the design frequency of the multi-band amplifier 100 described with reference to FIG. 4 is a frequency band $f_1$ and a frequency band $f_2$, only a signal of the frequency band $f_1$ may be inputted out of the design frequencies. This holds true in other embodiments.

EXPERIMENTAL EXAMPLE

Figure 28:
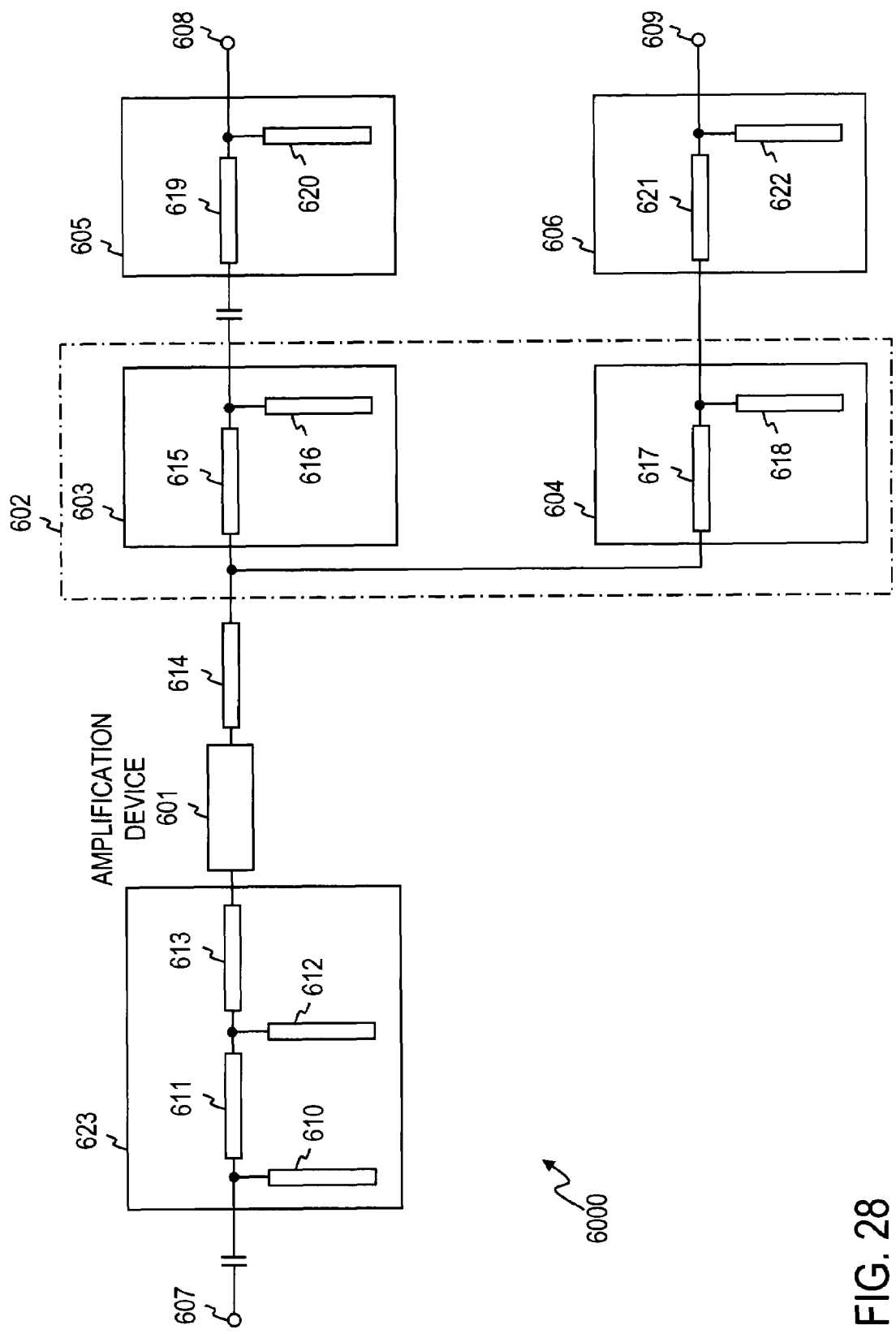
FIG. 28 is a view showing the function and configuration of a multi-band amplifier 6000 used for 1.5 GHz/2.5 GHz in an experiment.

FIG. 28 shows a design example of the multi-band amplifier for 1.5 GHz/2.5 GHz according to the present invention. A multi-band amplifier 6000 of FIG. 28 includes a matching circuit 623, an amplification device 601, a transmission line 614 having a length of 3.423 mm, a demultiplexer 602, a matching block 605 for performing impedance matching in a 2.5 GHz frequency band, and a matching block 606 for performing impedance matching in a 1.5 GHz frequency band.

The matching circuit 623 includes an open-end line 610 having a length of 4.823 mm, a transmission line 611 having a length of 2.886 mm, an open-end line 612 having a length of 9.205 mm, and a transmission line having a length of 4.823 mm. The matching circuit 623 is designed to obtain matching in each band.

The demultiplexer 602 includes a filter 603 and a filter 604. The filters 603 and 604 are designed based on the configuration of FIG. 14. To be specific, the filter 603 includes a transmission line 615 having a length of 19.75 mm and an open-end line 616 having a length of 19.75 mm. The filter 604 includes a transmission line 617 having a length of 11.83 mm and an open-end line 618 having a length of 11.83 mm.

The matching blocks 605 and 606 are configured such that for a signal of each frequency, a transmission line and an open-end line have an impedance equal to a system impedance with respect to the demultiplexer. To be specific, the matching block 605 includes a transmission line 619 having a length of 0.14 mm and an open-end line 620 having a length of 18.45 mm. The matching block 606 includes a transmission line 621 having a length of 0.04 mm and an open-end line 622 having a length of 0.2 mm.

Figure 29:
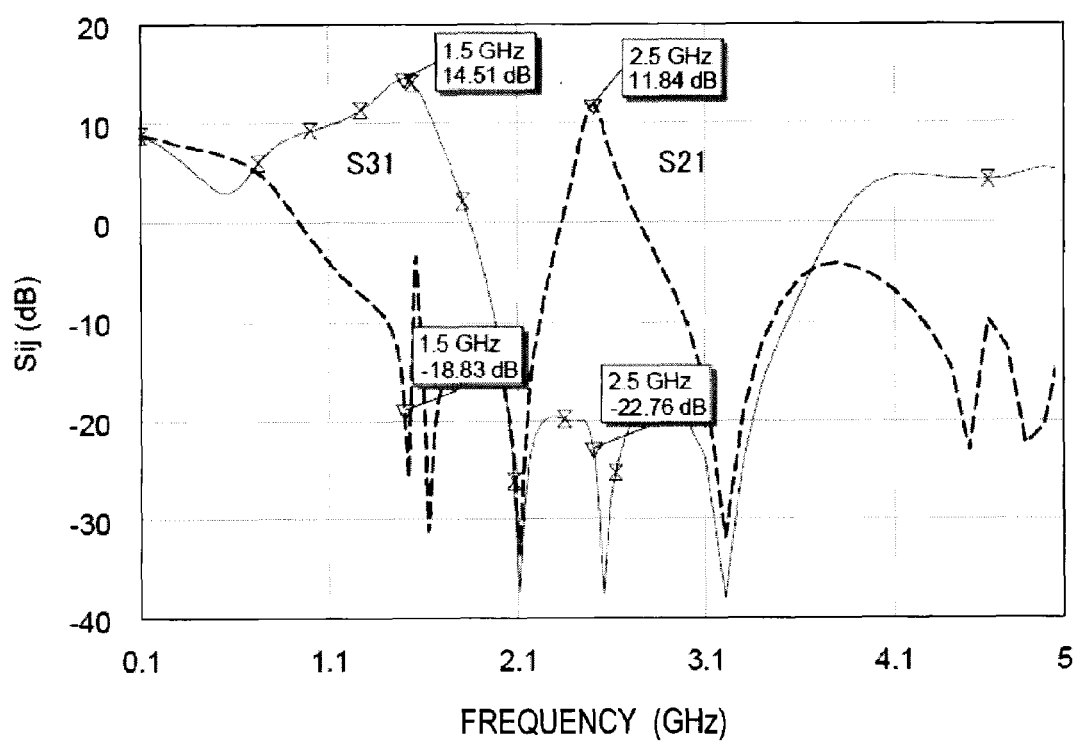
FIG. 29 is a view showing the frequency characteristics of the multi-band amplifier 6000.

FIG. 29 shows the frequency characteristics of the circuit. In FIG. 29, S21 indicates transmission characteristics from a port 607 to a port 608 and S31 indicates transmission characteristics from the port 607 to a port 609. In FIG. 29, S21 has the maximum gain at around 2.5 GHz and the multi-band amplifier operates as an amplifier of the 2.5 GHz band. S31 has the maximum gain at around 1.5 GHz and the multi-band amplifier operates as an amplifier of the 1.5 GHz band. On the other hand, S21 has a sufficiently small gain at around 1.5 GHz and S31 similarly has a sufficiently small gain at around 2.5 GHz. In other words, when signals of 2.5 GHz and 1.5 GHz are inputted to the multi-band amplifier 6000, the signals are amplified and outputted to the port 608 and the port 609, respectively. As is evident from FIG. 29, the signals of the two frequencies can be simultaneously amplified.

A matching circuit of the present invention performs impedance matching on each demultiplexed signal of each frequency band, thereby efficiently performing impedance matching in each frequency band. Further, according to the multi-band amplifier of the present invention, signals of multiple frequency bands can be simultaneously amplified with high efficiency and low noise by means of the matching circuits of the multi-band amplifier.

What is claimed is:

1. A matching circuit, comprising:
a demultiplexer for demultiplexing a signal outputted from an amplification device into signals of respective frequency bands; and
at least two matching blocks connected to the demultiplexer, for receiving the signals of the respective frequency bands and performing impedance matching in the respective frequency bands of the inputted signals,
wherein the demultiplexer has as many band elimination filters as the matching blocks, the band elimination filters receiving the signal outputted from the amplification device,
each of the band elimination filters comprises a transmission line and an end open line connected to one end of the transmission line, the transmission line and the end open line each having a length equal to a quarter of a wavelength of a frequency to be rejected by said each band elimination filter.

2. The matching circuit according to claim 1, further comprising an isolator on a terminal of an output side of the matching block.

3. The matching circuit according to claim 1, further comprising a pre-matching circuit between the amplification device and the demultiplexer.

4. The matching circuit according to claim 1, further comprising a multiplexer for multiplexing signals outputted from the matching blocks and outputting the multiplexed signal.

5. A matching circuit, comprising:
at least two matching blocks for receiving signals of respective frequency bands and performing impedance matching in the respective frequency bands of the inputted signals;
a multiplexer which is connected to the at least two matching blocks, for multiplexing signals outputted from the matching blocks, and output the multiplexed signal to an amplification device; and
a demultiplexer for demultiplexing an inputted signal into signals of the respective frequency bands and outputting the signals to the matching blocks,
wherein the demultiplexer has as many band elimination filters as demultiplexed frequency bands, the band elimination filters receiving the inputted signal,
each of the band elimination filters comprises a transmission line and an end open line connected to one end of the transmission line, the transmission line and the end open line each having a length equal to a quarter of a wavelength of a frequency to be rejected by said each band elimination filter.

6. The matching circuit according to claim 5, further comprising a pre-matching circuit between the amplification device and the multiplexer.

7. A multi-band amplifier, comprising:
the matching circuit according to claim 1; and
an amplification device for amplifying an inputted signal and outputting the amplified signal to a demultiplexer of the matching circuit.

8. A multi-band amplifier, comprising:
the matching circuit according to claim 5; and
an amplification device for amplifying a signal outputted from a multiplexer of the matching circuit and outputting the amplified signal.

9. A multi-band amplifier, comprising:
an output matching circuit a demultiplexer for demultiplexing a signal outputted from an amplification device into signals of respective frequency bands; and
at least two matching blocks connected to the demultiplexer, for receiving the signals of the respective frequency bands and performing impedance matching in the respective frequency bands of the inputted signals,
wherein the demultiplexer has as many band elimination filters as the matching blocks, the band elimination filters receiving the signal outputted from the amplification device, each of the band elimination filters comprises a transmission line and an end open line connected to one end of the transmission line, an input matching circuit comprising at least two matching blocks for receiving signals of respective frequency bands and performing impedance matching in the respective frequency bands of the inputted signals, and a multiplexer connected to the at least two matching blocks, for multiplexing signals outputted from the matching blocks and outputting the multiplexed signal; and an amplification device which is connected between a multiplexer of the input matching circuit and a demultiplexer of the output matching circuit, amplifies a signal outputted from the multiplexer of the input matching circuit, and outputs the amplified signal to the demultiplexer of the output matching circuit.

10. A multi-band amplifier, comprising:

at least two amplifiers, each of the at least two amplifiers comprising an amplification device for amplifying an inputted signal, a demultiplexer with band elimination filters for demultiplexing a signal outputted from the amplification device into signals of respective frequency bands and at least two matching blocks connected to the demultiplexer, for receiving the signals of the respective frequency bands and performing impedance matching in the respective frequency bands of the inputted signals;

the at least two amplifiers having different saturation output powers, control means for selecting one of the at least two amplifiers based on a power of an inputted signal, and driving only the selected amplifier; and at least two multiplexers connected respectively to matching blocks for outputting signals of the same frequency band, out of matching blocks of the amplifiers.

11. A multi-band amplifier, comprising:

a first Butler matrix which has B input terminals and B output terminals, B represents a given natural number, equally distributes each of input signals fed to the B input terminals to the B output terminals with a predetermined phase difference to thereby output B combined signals at the B output terminals;

the B series connections each of which has a first matching circuit, the first matching circuit receiving one of the B signals, amplification device which amplifies a signal outputted from the input matching circuit and outputs the amplified signal, and a second matching circuit, the second matching circuit receiving the signal outputted from the amplification device; and a second Butler matrix which has B input terminals and B output terminals, equally distributes each of signals from the B second matching circuits fed to the B input terminals to the B output terminals with a predetermined phase difference to thereby output B signals, wherein the first matching circuit comprises a demultiplexer with band elimination filters for demultiplexing said one of the B signals into signals of respective frequency bands, at least two matching blocks connected to the demultiplexer, for receiving the signals of the respective frequency bands and performing impedance matching in the respective frequency bands of the inputted signals, and a multiplexer for multiplexing signals outputted from the matching blocks and outputting the multiplexed signal, the second matching circuit comprises a demultiplexer for demultiplexing a signal outputted from the amplification device into signals of respective frequency bands, at least two matching blocks connected to the demultiplexer, for receiving the signals of the respective frequency bands and performing impedance matching in the respective frequency bands of the inputted signals, and a multiplexer for multiplexing signals outputted from the matching blocks and outputting the multiplexed signal.

12. A multi-band amplifier, comprising:

a plurality of first Butler matrixes each of which has B input terminals and B output terminals, B represents a given natural number, equally distributes each of input signals fed to the B input terminals to the B output terminals with a predetermined phase difference to thereby output B combined signals at the B output terminals;

the B series connections each of which has a first matching circuit, the first matching circuit receiving the combined signals each from an output terminal of different one of said plurality of first Butler matrixes, amplification device which amplifies a signal outputted from the first input matching circuit and outputs the amplified signal, and a second matching circuit receiving the amplified signal; and a plurality of second Butler matrixes each of which has B input terminals and B output terminals, equally distributes each of signals of the same frequency band from the B second matching circuits fed to the B input terminals to the B output terminals with a predetermined phase difference to thereby output B signals at the B output terminals, wherein the first matching circuit comprises at least two matching blocks for receiving signals of respective frequency bands and performing impedance matching in the respective frequency bands of the inputted signals, and a multiplexer connected to the at least two matching blocks, for multiplexing signals outputted from the matching blocks and outputting the multiplexed signal, the second matching circuit comprises a demultiplexer having band elimination filters for demultiplexing a signal outputted from the amplification device into signals of respective frequency bands and at least two matching blocks connected to the demultiplexer, for receiving the signals of the respective frequency bands and performing impedance matching in the respective frequency bands of the inputted signals.

13. A multi-band amplifier, comprising:

a plurality of input-side Doherty networks each of which divides an input signal into two, shifts one of the divided signals in phase from the other signal by 90 degrees, and outputs the two signals;

a first input matching circuit comprising at least two matching blocks for receiving a first signal out of signals outputted from the input-side Doherty networks and performing impedance matching in the respective frequency bands of the inputted signals, and a multiplexer connected to the at least two matching blocks, for multiplexing signals outputted form the matching blocks and outputting the multiplexed signal;

a first amplification device for amplifying the multiplexed signal outputted from the first input matching circuit;

a first output matching circuit comprising a demultiplexer having bad elimination filters for demultiplexing a signal outputted from the first amplification device into signals of respective frequency bands, and at least two matching blocks connected to the demultiplexer, for receiving the signals of the respective frequency bands and performing impedance matching in the respective frequency bands of the inputted signals;

a second input matching circuit comprising at least two matching blocks for receiving a second signal out of signals outputted from the input-side Doherty networks and performing impedance matching in the respective frequency bands of the inputted signals, and a multiplexer connected to the at least two matching blocks, for multiplexing signals outputted from the matching blocks and outputting the multiplexed signal;

a second amplification device for amplifying the multiplexed signal outputted from the second input matching circuit;

a second output matching circuit comprising a demultiplexer for demultiplexing a signal outputted from the second amplification device into signals of respective frequency bands, and at least two matching blocks connected to the demultiplexer, for receiving the signals of the respective frequency bands and performing impedance matching in the respective frequency bands of the input signals; and a plurality of output-side Doherty networks each of which receivers signals of the same frequency band out of signals outputted from the output matching circuits, shifts one of the inputted signals in phase from the other signal by 90 degrees, and outputs the phase shifted signal.

14. A matching circuit, comprising:

a demultiplexer for demultiplexing a signal outputted from an amplification device into signals of respective frequency bands; and at least two matching blocks connected to the demultiplexer, for receiving the signals of the respective frequency bands and performing impedance matching in the respective frequency bands of the inputted signals, wherein the demultiplexer has as many band elimination filters as the matching blocks, the band elimination filters receiving the signal outputted from the amplification device, each of the band elimination filters comprises a transmission line two or more end open lines, each of end open lines having a length equal to a quarter of a wavelength of a respective frequency to be rejected by said each end open line and being connectable to the transmission line at a distance of the length of said each end open line from an end of the transmission line; and switching devices are provided between the transmission line and the end open lines, for selectively connecting one of the end open lines to the transmission line.

15. A matching circuit, comprising:

at least two matching blocks for receiving signals of respective frequency bands and performing impedance matching in the respective frequency bands of the inputted signals, a multiplexer which is connected to the at least two matching blocks, for multiplexing signals outputted from the matching blocks, and output the multiplexed signal to an amplification device; and a demultiplexer for demultiplexing an inputted signal into signals of the respective frequency bands and outputting the signals to the matching blocks, wherein the demultiplexer has as many band elimination filters as demultiplexed frequency bands, the band elimination filters receiving the inputted signal, each of the band elimination filters comprises a transmission line two or more end open lines, each of end open lines having a length equal to a quarter of a wavelength of a respective frequency to be rejected by said each end open line and being connectable to the transmission line at a distance of the length of said each end open line from an end of the transmission line; and open lines, for selectively connecting one of the end open lines to the transmission line.

* * * * *